US012740269B2

(12) United States Patent
Ma

(10) Patent No.: US 12,740,269 B2
(45) Date of Patent: Sep. 15, 2026

(54) DISPLAY PANEL, METHOD FOR MANUFACTURING THE SAME, AND DISPLAY DEVICE COMPRISING THE SAME

(71) Applicant: XIAMEN TIANMA DISPLAY TECHNOLOGY CO., LTD., Xiamen (CN)

(72) Inventor: Hongshuai Ma, Wuhan (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 332 days.

(21) Appl. No.: 18/648,484

(22) Filed: Apr. 29, 2024

(65) Prior Publication Data

US 2024/0284736 A1 Aug. 22, 2024

(30) Foreign Application Priority Data

Sep. 27, 2023 (CN) ......................... 202311262370.8

(51) Int. Cl.

| | |
|---|---|
| ***H10K 59/131*** | (2023.01) |
| ***H10K 59/12*** | (2023.01) |
| ***H10K 59/40*** | (2023.01) |
| ***H10K 59/80*** | (2023.01) |

(52) U.S. Cl.

CPC ....... *H10K 59/131* (2023.02); *H10K 59/1201* (2023.02); *H10K 59/40* (2023.02); *H10K 59/80522* (2023.02)

(58) Field of Classification Search

CPC .. H10K 59/131; H10K 59/1201; H10K 59/40; H10K 59/80522; H10K 59/1315

See application file for complete search history.

(56) References Cited

U.S. PATENT DOCUMENTS

2021/0367025 A1* 11/2021 Huang ..................... G09G 3/20
2023/0014363 A1* 1/2023 Ikeda ................... H10H 20/855

* cited by examiner

*Primary Examiner* — Shahan Ur Rahaman

(74) *Attorney, Agent, or Firm* — KILPATRICK TOWNSEND & STOCKTON LLP

(57) ABSTRACT

A display panel, including an array substrate and light-emitting elements at a side of the array substrate. The array substrate includes a first signal line, a first auxiliary line, and a second auxiliary line disposed in a display region of the display panel. The first auxiliary line is configured to transmit signals to the first signal line, and includes at least one first auxiliary line segment. The second auxiliary line is insulated from the first auxiliary line, and includes at least one second auxiliary line segment. Each second auxiliary line segment is disposed in a same layer as a corresponding first auxiliary line segment. Each light-emitting element includes an anode, a light-emitting functional layer, and a cathode, which sequentially arranged along a direction pointing away from the array substrate. The cathode is electrically connected to the at least one second auxiliary line segment in the display region.

24 Claims, 23 Drawing Sheets

DISPLAY PANEL, METHOD FOR MANUFACTURING THE SAME, AND DISPLAY DEVICE COMPRISING THE SAME

This application claims priority to Chinese Patent Application No. 202311262370.8, titled "DISPLAY PANEL, METHOD FOR MANUFACTURING THE SAME, AND DISPLAY DEVICE COMPRISING THE SAME", filed on Sep. 27, 2023 with the China National Intellectual Property Administration, which is incorporated herein by reference in its entirety.

FIELD

The present disclosure relates to the field of display technology, and in particular to a display panel, a method for preparing the display panel, and a display device.

BACKGROUND

In conventional display panels, a cathode power line generally circumvents a display region through a non-display region, and is overlaid with a cathode at an upper left or upper right portion of a frame, to supply a voltage to the cathode. Since the cathode is located at a light-emitting side and requires good light transmittance, a thickness of the cathode should be small enough, which results in large resistance of the cathode. Hence, besides a voltage drop across the cathode power line, there is another voltage drop across the cathode. The large voltage drop results in non-uniform potential distribution across the cathode, and different light-emitting elements are subject to different cathode potentials. The display brightness is thus inconsistent throughout the display panels.

SUMMARY

A display panel, a method for manufacturing the display panel, and a display device are provided according to embodiments of the present disclosure. Resistance of a cathode is reduced, and a voltage drop across the cathode is small and a potential across the cathode is uniform. Cathode potentials of different light-emitting elements are subject to smaller differences, and display brightness is more consistent.

In one embodiment, a display panel is provided according to embodiments of the present disclosure. The display panel includes an array substrate and multiple light-emitting elements disposed at a side of the array substrate. The array substrate includes a first signal line, a first auxiliary line, and a second auxiliary line, which are disposed in a display region of the display panel. The first auxiliary line is configured to transmit signals to the first signal line, and includes at least one first auxiliary line segment. The second auxiliary line is insulated from the first auxiliary line, and includes at least one second auxiliary line segment. Each of the at least one second auxiliary line segment is disposed in a same layer as a corresponding one of the at least one first auxiliary line segment. Each of the multiple light-emitting elements includes an anode, a light-emitting functional layer, and a cathode, which are arranged in the above-listed sequence along a direction pointing away from the array substrate. The cathode is electrically connected to the at least one second auxiliary line segment in the display region.

In another embodiment, a method for manufacturing a display panel is provided according to embodiments of the present disclosure. The method includes: forming an array substrate, where the array substrate includes a first signal line, a first auxiliary line, and a second auxiliary line, which are disposed in a display region of the display panel, the first auxiliary line is configured to transmit signals to the first signal line, the second auxiliary line is insulated from the first auxiliary line, the first auxiliary line includes at least one first auxiliary line segment, the second auxiliary line includes at least one second auxiliary line segment, and the at least one second auxiliary line segment and the at least one first auxiliary line segment are on a same layer; and forming multiple light-emitting elements at a side of the array substrate, where each of the multiple light-emitting elements includes an anode, a light-emitting functional layer, and a cathode, and the cathode is electrically connected to a corresponding one of the at least one second auxiliary line segment in the display region.

In another embodiment, a display device is provided according to embodiments of the present disclosure. The display device includes the foregoing display panel.

The embodiments are advantageous over the conventional technology in as least following embodiment.

Herein the first auxiliary line for transmitting signals to the first signal line is disposed in the display region of the display panel, and the first auxiliary line includes at least one first auxiliary line segment. That is, wiring for transmitting signals to the first signal line is arranged in the display region, which spares a dedicated space for such wiring and improves space utilization in the display panel. Furthermore, the second auxiliary line is disposed in the display region, which improves uniformity of etching processing and reflection of the display panel. The second auxiliary line is insulated from the first auxiliary line and includes at least one second auxiliary line segment, and the second auxiliary line segment and the first auxiliary line segment are disposed in the same layer. The second auxiliary line segment is electrically connected to the cathode(s) in the display region to form parallel connection between the two, and the resistance of the cathode is reduced. In one embodiment a voltage drop across the cathode is reduced, a potential across the cathode is more uniform. Thus, stability and uniformity of the cathode potential are improved among the different light-emitting elements, and display brightness is more consist throughout the display panel.

BRIEF DESCRIPTION OF THE DRAWINGS

Hereinafter drawings to be applied in embodiments of the present disclosure are briefly described, in order to clarify illustration of the embodiments of the present disclosure. Apparently, the drawings in the following descriptions are only some embodiments of the present disclosure.

DETAILED DESCRIPTION OF EMBODIMENTS

Figure 1:
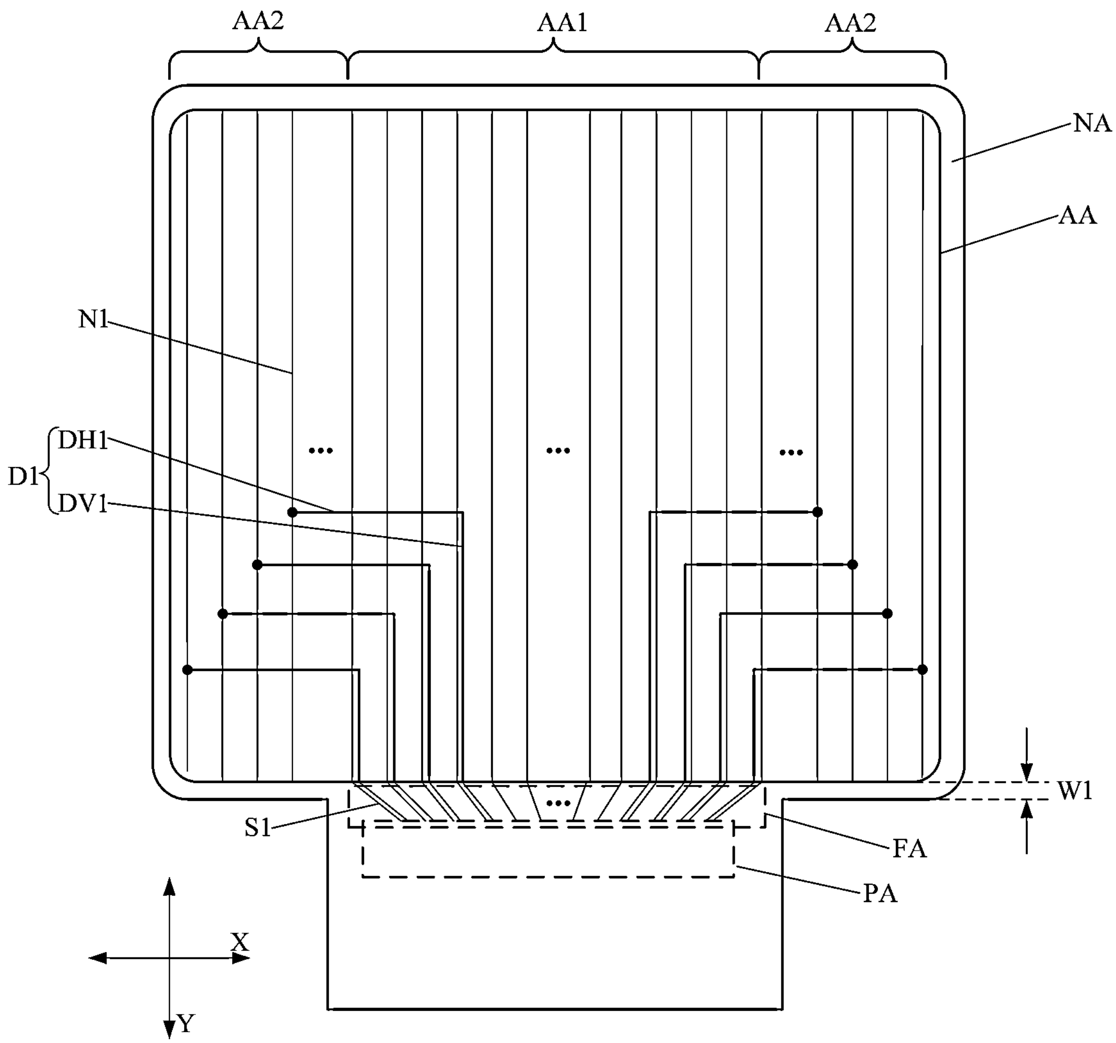
FIG. 1 is a schematic top view of a display panel according to an embodiment of the present disclosure.

Hereinafter the embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure fall within the scope of protection of the present disclosure.

Various specific details are set forth in following description for thorough understanding of the present disclosure. The present disclosure may be implemented in other embodiments different from those described herein. Therefore, the present disclosure is not limited to following specific embodiments.

When illustrating embodiments of the present disclosure in conjunction with the drawing, for the sake of conciseness and convenience, a cross-sectional diagram of a device structure may not be enlarged to scale in all parts. The drawings are only exemplary and shall not be construed as limitations on the protection scope of the present disclosure. Practical manufacturing should concern three-dimensional dimensions such as a length, a width, and a depth.

As stated in the background section, conventional display panels are subject to a problem of a large voltage drop and non-uniform potential distribution across the cathode. Hence, different light-emitting elements are subject to different cathode potentials, and display brightness is inconsistent throughout the display panels.

A display panel is provided according to an embodiment of the present disclosure, which addresses at least the above issue. FIG. 1 shows a schematic top view of a display panel according to an embodiment of the present disclosure. As shown in FIG. 1, the display panel includes a display region AA. A first signal line N1 and a first auxiliary line D1 are disposed in the display region AA. The first auxiliary line D1 is configured to transmit signal(s) to the first signal line N1.

In one embodiment, the first signal line N1 may be a data line.

Reference is made to FIG. 1. In the display panel, the display region AA includes a first display region AA1 and a second display region AA2, which is located on at least one side of the first display region AA1 along an X direction. The display panel further includes a non-display region NA at least partially surrounding (i.e., on at least a part of a peripheral of) the display region AA2. The non-display region NA includes a fan-out region FA located at a side of the display region AA along a Y direction. Multiple fan-out traces S1 are disposed in the fan-out region FA. The X direction is not parallel with the Y direction.

Reference is further made to FIG. 1. In the display panel, the non-display region NA may further includes a pad region PA located at a side of the fan-out region FA away from the display region AA. Multiple pads are provided in the pad region PA, and may include a data pad, a power pad, and the like. After the display panel is manufactured, a driving integrated circuit (IC) is bonded to a data pad, a power pad, or the like in the pad region PA. In practice, the pad region PA may be bent toward a backside of the display panel.

The first signal lines N1 in the display region AA needs to be electrically connected to the fan-out traces S1 in the fan-out region FA. Accordingly, the signals (e.g., data signals) outputted by the driver IC may be transmitted to the first signal lines N1 in the display region AA via the pads in the pad region PA and the fan-out traces S1 in the fan-out region FA. In one embodiment the pixel circuits in the display region AA can be driven for operation, and the light-emitting elements in the display region AA can be driven for light-emission.

Reference is further made to FIG. 1. The first display region AA1 is located in a central part of the display region AA along the X direction. The first signal lines N1 in the first display region AA1 may be electrically connected directly to the fan-out traces S1 in the fan-out region FA. The second display region AA2 is located at left and/or right of the display region AA along the X direction. In some conventional display panels, the fan-out traces S1 in the fan-out region FA would wind in the non-display region at a lower frame of the display panel, to electrically connect the first signal lines N1 in the second display region AA2. In such scheme, these fan-out traces S1 are disposed in a lower left part and/or a lower right part of a frame of the display panel, and thereby occupy a large space along the Y direction. It is difficult to narrow the lower frame of the display panel.

In this embodiment, as shown in FIG. 1, a first auxiliary line D1 is disposed in the display region AA of the display panel, and the first auxiliary line D1 includes at least one first auxiliary line segment. In an embodiment, the first signal lines N1 extend along the Y direction, the at least one first auxiliary line segment in the first auxiliary line D1 includes a first segment DV1 and a second segment DH1, and an extending direction of the first segment DV1 intersects with the extending direction of the second segment DH1. The first segment DV1 may extend along the Y direction while the second segment DH1 may extend along the X direction. The first signal line(s) N1 in the second display region AA2 may be electrically to the second segment(s) DH1 extending along the X direction, then to the first segment DV1 extending along the Y direction, and then to the fan-out trace(s) S1 in the fan-out region FA. Therefore, it is not necessary to dispose the fan-out traces S1 at the lower left part or the lower right part of the frame of the display panel, which allows a lower frame of the display panel to shrink. A narrow frame of the display panel is facilitated, and especially a width Wi of the lower frame of the display panel can be significantly reduced.

The first segment DV1 and the second segment DH1 are arranged in different layers. In a direction perpendicular to the thickness of the display panel. A through hole may be provided in an overlapping region between the first segment DV1 and the second segment DH1 when viewed along a thickness direction of the display panel. In one embodiment the first segment DV1 and the second segment DH1 are connected via the through hole, and hence the first signal line(s) N1 in the second display region AA2 are connected to the fan-out trace(s) S1 in the fan-out region FA.

In the foregoing embodiments, it is taken as an example that the second display region AA2 is located at the left and/or right of the display region AA along the X direction. The second display region AA2 may be configured in other parts of the display region AA. Hence, the first signal line(s) N1 in any part of the display region AA may be electrically connected to the fan-out trace(s) S1 in the fan-out region FA via the first auxiliary line(s) D1 in the display region AA.

A quantity of the first auxiliary line segments in the first auxiliary line D1 is not limited herein. FIG. 1 only shows that the first signal line N1 in the second display region AA2 is connected to one second segment DH1, then to one first segment DV1, and then to the corresponding fan-out trace S1 in the fan-out region FA. In another embodiment, the first signal line N1 in the second display region AA2 is connected to one second segment DH1, then to one first segment DV1, then to another second segment DH1, then to another first segment DV1, and eventually to the fan-out trace S1 in the fan-out region FA. A specific configuration may depend on an actual situation.

Herein the first auxiliary line(s) N1 are disposed in the display region AA, and hence the first signal line(s) N1 in the second display region AA2 can be connected to the fan-out trace(s) S1 in the fan-out region FA via the first auxiliary line(s) D1. That is, a part of the fan-out traces is actually disposed in the display region (i.e., Fanout in AA, FIAA). Wiring for transmitting signals to the first signal lines N1 is disposed in the display region AA, which reduces a dedicated space for such wiring (e.g., reduces a space occupied by the fan-out region). Space utilization of the display panel is improved.

Herein the first auxiliary line D1 in the display region AA is for transmitting signals to the first signal line N1, and is not limited to that connecting the fan-out trace S1 and the first signal line N1 in the display region AA.

Figure 2:
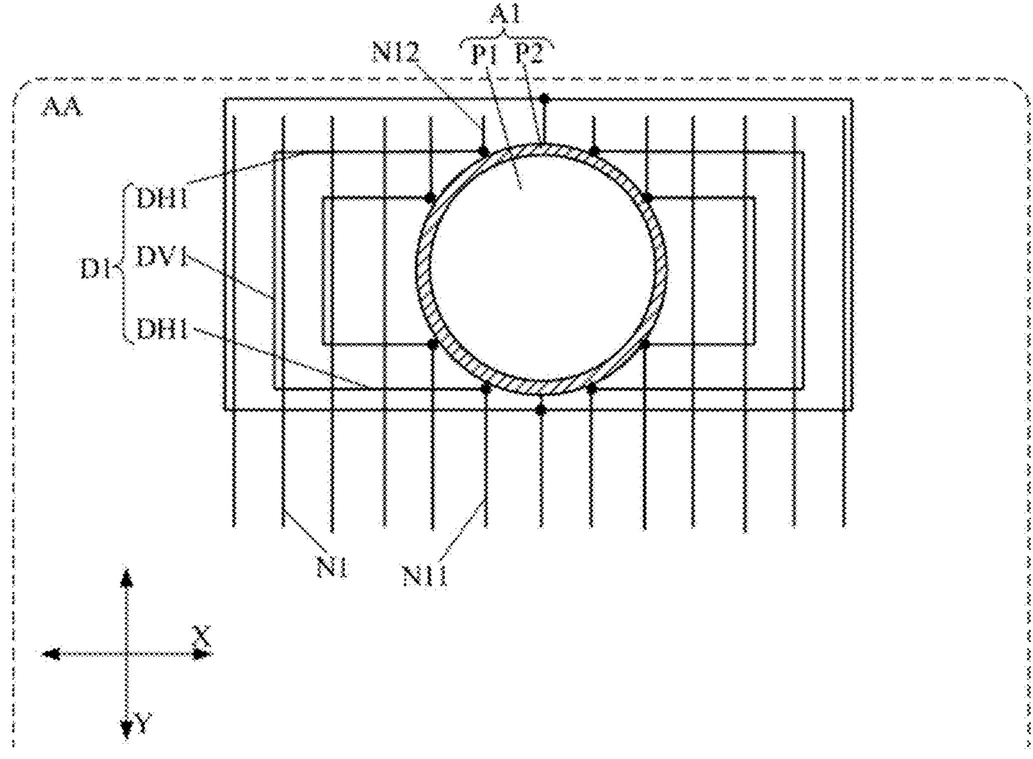
FIG. 2 is a partial top view of a display panel according to another embodiment of the present disclosure.

Reference is made to FIG. 2, which shows a partial top view of a display panel according to another embodiment of the present disclosure. As shown in FIG. 2, the display panel further includes a first region A1, and the display region AA surrounds the first region A1 at least partially. The first region A1 is configured for accommodate an under-screen camera, and may include an opening region P1 and a packaging region P2. The opening region P1 is configured to provide an aperture for a light path during imaging of the cameral, and the packaging region P2 surrounds the opening region P1. In the packaging region P2 An isolation pillar and/or an isolation groove may be disposed surrounding the punching region P1, to prevent diffusion of water and oxygen.

Reference is further made to FIG. 2. The first signal lines N1 (which may be data lines) extend along the Y direction, and a part of the first signal line N1 each is dissected by the first region A1 into two segments, N11 and N12. The first segment N11 is located at one side of the first region A1 along the Y direction, and the second segment N12 is located at the other side of the first region A1 along the Y direction. In some conventional display panels, the first segment N11 of the first signal line N1 would wind along a periphery of the first region A1 until it can be electrically connected to the second segment N12. In such case, wiring around the first region A1 are so dense that a neighboring region of the first region A1 is incapable to display content, which reduces an area of the display region. In a case that the first segment N11 of the first signal line N1 winds within the packaging region P2 to electrically connect the second segment N12, the packaging region P2 would be enlarged which also reduces an area of the display region.

In this embodiment, as shown in FIG. 2, the first auxiliary line D1 is disposed in the display region AA in the display panel, and includes two segments DH1 and one segment DV1. Each segment DH1 extends along the X direction, the segment DV1 extends along the Y direction. Hence, the first segment N11 in the first signal line N1 is electrically connected first to one segment DH1, then to the segment DV1, then to the other segment DH1, and eventually to the second segment N12. The two segments DH1 and segment DV1 of the first auxiliary line D1 are both located in the display region AA, and hence neither wiring surrounding the first region A1 would be too dense to affect a display effect, nor that the packaging region P2 would be enlarged to a large dimension.

In FIG. 2, it is taken as an example that the first signal lines N1 extend along the Y direction. In case of extending along the X direction, the first signal line N1 would also dissected into two or even more segments by a region corresponding to the under-screen camera. Hence, it is also feasible to dispose the first auxiliary line D1 in the display region AA for connecting the two or even more segments in the first signal line N1. In such case, the first signal lines N1 may carry a scanning signal, a light-emitting control signal, or the like.

In the first auxiliary line D1, the two segments DH1 extending along the same direction may be disposed in the same layer, and each segment DH1 should be disposed in a different layer from the segment DV1 which extends along a different direction. Hence, a through hole may be provided in an overlapping region between each segment DH1 and the segment DV1 when viewed along a thickness direction of the display panel, and each segment DH1 and the segment DV1 are connected via the through hole.

That is, the first auxiliary line D1 for transmitting signals to the first signal line N1 may be configured as one for connecting two or even more segments for by dissecting the first signal line N1 by the region corresponding to the under-screen camera.

In summary, the first auxiliary line(s) D1 for transmitting signals to the first signal line N1 may be disposed in the display region AA for connecting the first signal line(s) N1 and other wiring, such as the fan-out trace(s) S1, or connecting different segments of the first signal line(s) N1. Both cases have the advantages of reducing the dedicated space for the wiring that transmits signals to the first signal line and improving the space utilization of the display panel.

A type of the first signal line N1 is not limited herein. The first signal line N1 may be a data line, a scanning line, a light-emitting control line, or the like. The extending direction of the first signal line N1 is not limited herein. The first signal line N1 may extend along the X direction or the Y direction, which depends on an actual situation.

Since the first auxiliary line D1 in the display region AA is configured to transmit signals to a corresponding first signal line N1, the first auxiliary line D1 may cross some first signal line(s) N1. Therefore, at least a part of the first auxiliary line D1 needs to be disposed in a different layer from the first signal lines N1, to prevent a short circuit between the first auxiliary line D1 and the first signal lines N1 other than the corresponding one. In one embodiment, the first auxiliary line D1 may be connected to the corresponding first signal line N1 via a through hole, which is formed in an insulating layer between the two.

Hereinafter it is taken as an example that the first auxiliary line D1 in the display region AA is configured to connect the first signal line N1 and the fan-out trace S1.

Figure 3:
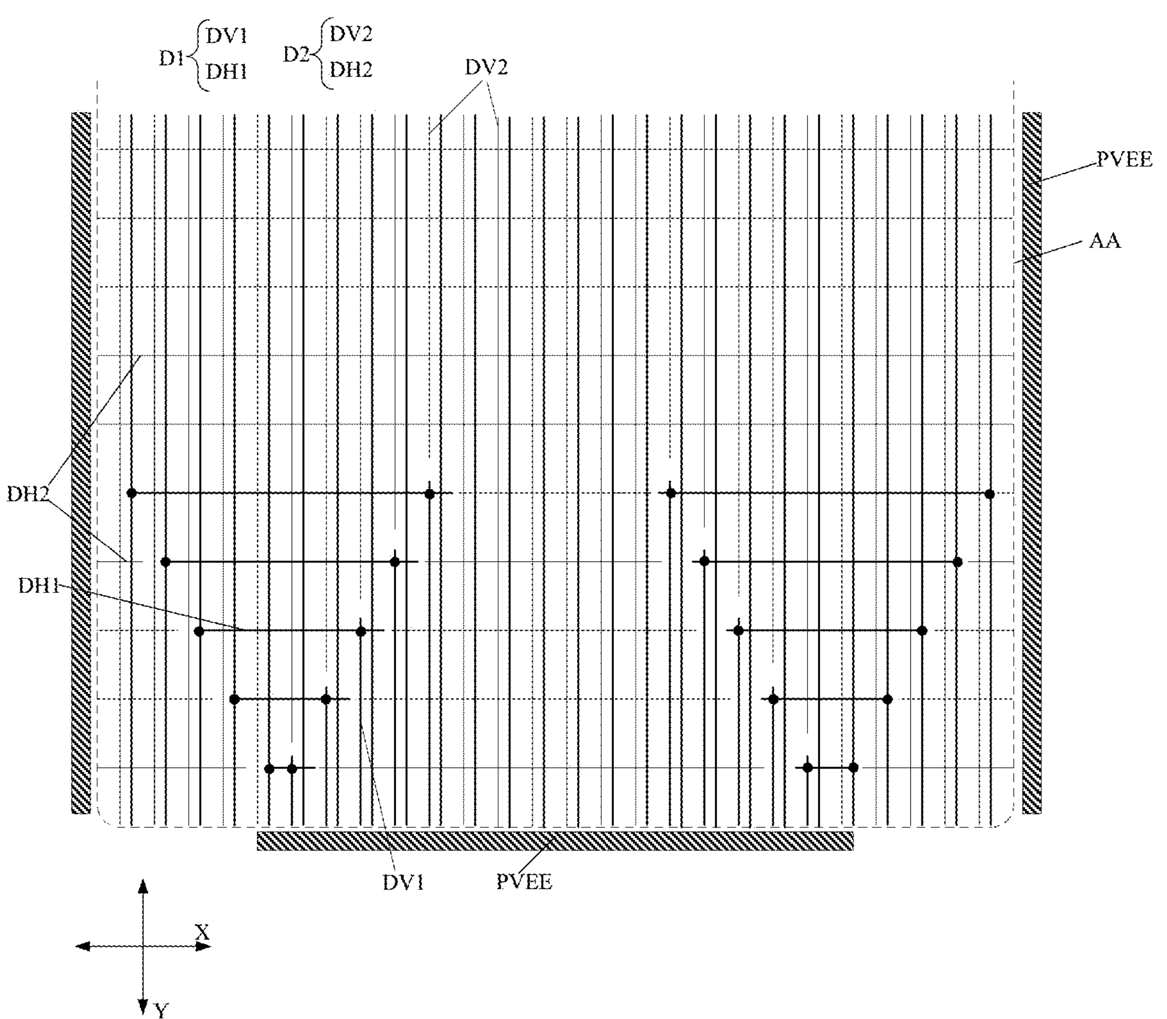
FIG. 3 is an enlarged partial top view of a display panel according to an embodiment of the present disclosure.

FIG. 3 shows an enlarged partial top view of a display panel according to an embodiment of the present disclosure. As shown in FIG. 3, a second auxiliary line D2 is further provided in the display region AA to ensure uniformity of etching processing and reflection of the display panel. The second auxiliary line D2 is insulated from the first auxiliary line D1, and includes at least one second auxiliary line segment. The at least one second auxiliary line segment is disposed in the same layer(s) as the at least one first auxiliary line segment.

Reference is made to FIG. 3. In one embodiment, the at least one first auxiliary line segment in the first auxiliary line D1 includes a first segment DV1 and a second segment DH1, and the first segment DV1 and the second segment DH1 are disposed in different layers. The extending direction of the first segment DV1 intersects with the extending direction of the second segment DH1. The first segment DV1 extends along the Y direction, while the second segment DH1 extends along the X direction. In order to achieve the uniformity of etching processing and reflection of the display panel, the at least one second auxiliary line segment in the second auxiliary line D2 includes a third segment DV2 and a fourth segment DH2. The third segment DV2 and the first segment DV1 are disposed in the same layer and extend along the same direction. The fourth segment DH2 and the second segment DH1 are disposed in the same layer and extend along the same direction.

That is, the first auxiliary line D1 includes the at least one first auxiliary line segment, the second auxiliary line D2 includes the at least one second auxiliary line segment, and the at least one first auxiliary line segment and the at least one second auxiliary line segment are disposed in the same layer(s) in one-to-one correspondence. In one embodiment, the at least one first auxiliary line segment and the at least one the second auxiliary line segment are insulated from each other regardless being configured in the same layer or different layers, and the first auxiliary line D1 is isolated from the second auxiliary line D2.

Herein the term "same layer" mentioned refers to layer structure(s) formed as follows. Film(s) for a certain pattern are formed through a same filming process, and then patterned under the same mask through a same patterning process. The patterning process may include multiple rounds of exposure, development, or etching, which depends on the pattern. Graphics of the patter in the layer structure(s) may be continuous or discontinuous, and may correspond to different heights or thicknesses. The one-to-one same-layer correspondence between the at least one first auxiliary line segment and the at least one second auxiliary line segment renders etching and reflection of the display panel uniform.

Reference is further made to FIG. 3. The third segment DV2 in the second auxiliary line D2 may be a whole (i.e., full-length) segment extending along the Y direction which transmits signals to no first signal line N1, or may be a partial (i.e., truncated-length) segment extending along the Y direction which transmits signals to no first signal line N1. Similarly, the fourth segment DH2 may be a whole segment extending along the X direction which transmits signals to no first signal line N1, or may be a partial segment extending along the X direction which transmits signals to no first signal line N1.

Hereinafter it is taken as an example that: the first auxiliary line D1 includes the first segment DV1 and the second segment DH1, the second auxiliary line D2 includes the third segment DV2 and the fourth segment DH2, the first segment DV1 and the second segment DH1 are disposed in different layers, the extending direction of the first segment DV1 intersects with the extending direction of the second segment DH1, the third segment DV2 and the first segment DV1 are disposed in the same layer and extend along the same direction, and the fourth segment DH2 and the second segment DH1 are disposed in the same layer and extend along the same direction.

Figure 4:
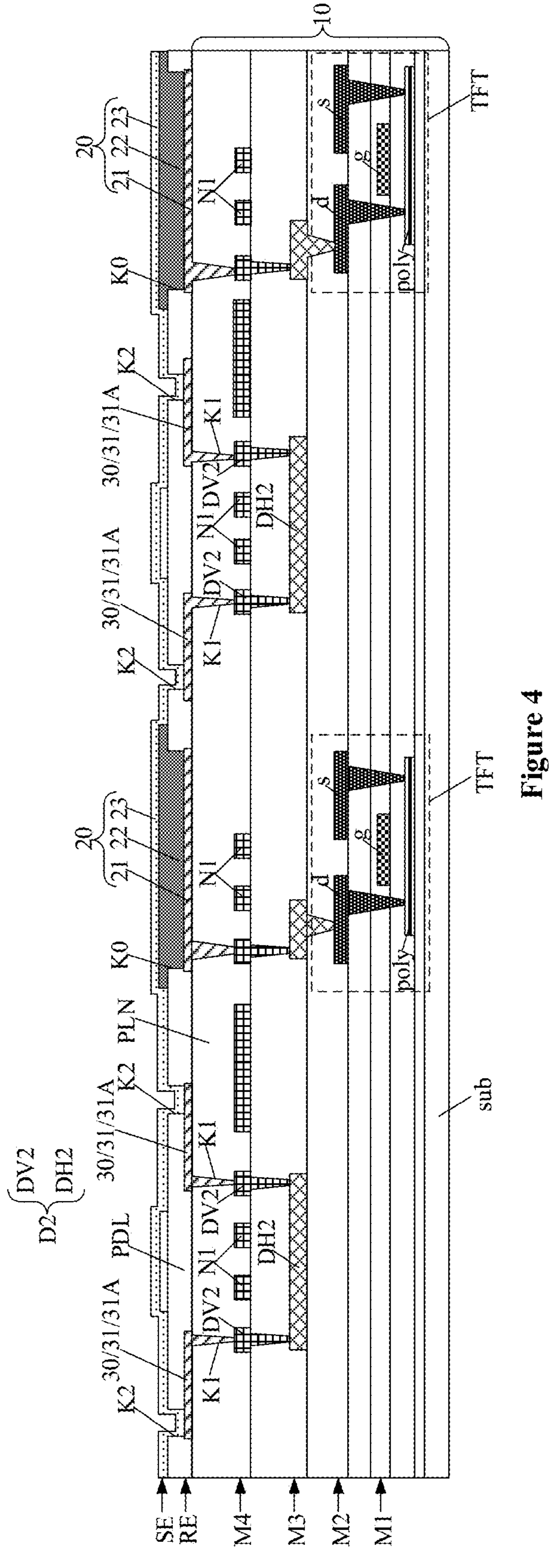
FIG. 4 is a schematic cross-sectional view of a display panel according to an embodiment of the present disclosure.

FIG. 4 shows a schematic cross-sectional view of a display panel according to an embodiment of the present disclosure. As shown in FIG. 4, the display panel further includes an array substrate 10 and multiple light-emitting elements 20 disposed at a side of the array substrate 10.

The array substrate 10 includes the first signal line N1, the first auxiliary line D1 and the second auxiliary line D2.

Each of the multiple light-emitting elements 20 includes an anode 21, a light-emitting functional layer 22, and a cathode 23, which are arranged in the above-listed sequence along a direction pointing away from the array substrate 10. In the display region AA, the cathode 23 is electrically connected to the second auxiliary line segment (e.g., the third segment DV2).

Reference is made to FIG. 4. The array substrate 10 further includes a base substrate (sub), an active layer (poly) disposed at a side of the base substrate, and multiple metal layers disposed at a side of the active layer away from the base substrate. The multiple metal layers may include a metal layer M1, a metal layer M2, a metal layer M3, and a metal layer M4 arranged in the above-listed sequence along a direction pointing away from the base substrate, and every pair of adjacent metal layers are separated by an insulating layer. On such basis, multiple pixel circuits and multiple signal lines are formed in the array substrate 10 to drive the light-emitting elements 20 for light emission. In FIG. 4, the arrows indicate levels at which the respective metal layers are located, and do not terminate at the respective metal layers. Herein other drawings adopt similar manners for concise illustration, which would not be explained in following description.

Figure 5:
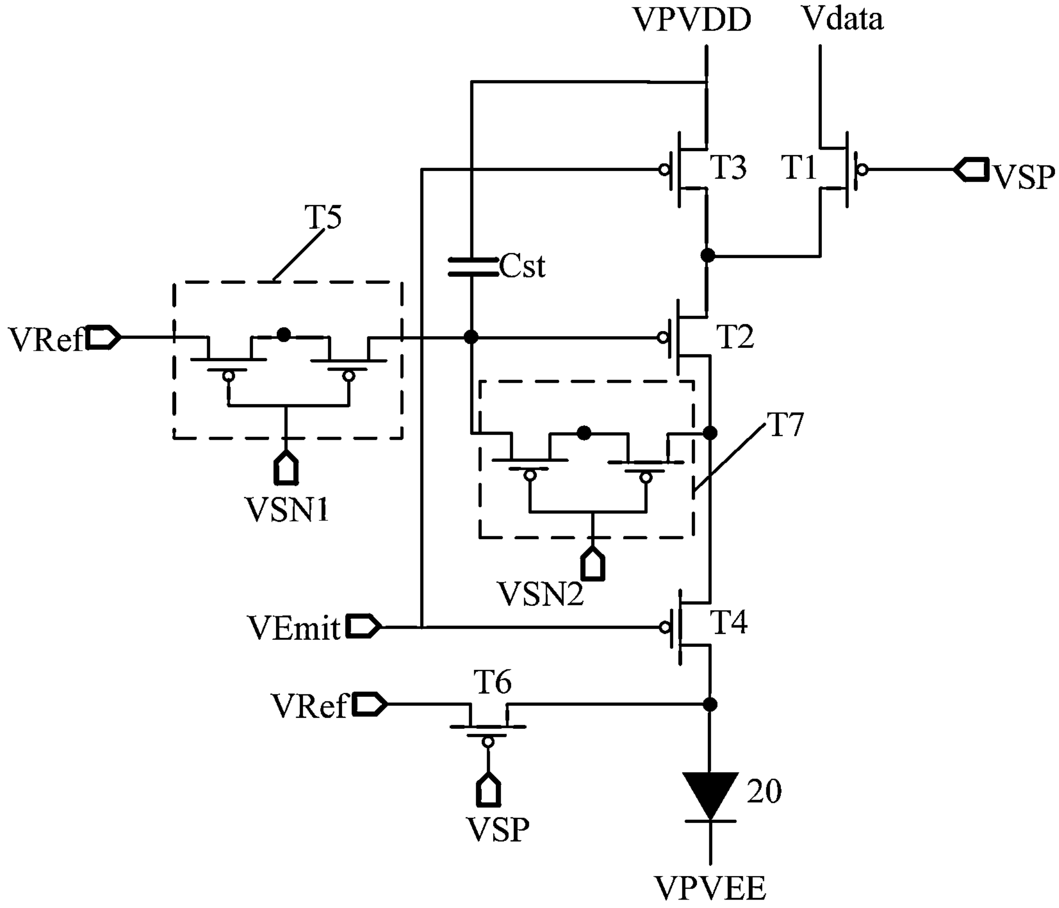
FIG. 5 is a schematic structural diagram of a pixel circuit of a display panel according to an embodiment of the present disclosure.

FIG. 5 shows a schematic structural diagram of a pixel circuit in a display panel according to an embodiment of the present disclosure. As shown in FIG. 5, the pixel circuit includes a data writing transistor T1, a driving transistor T2, a power writing transistor T3, a light-emitting control transistor T4, a gate initializing transistor T5, an anode initializing transistor T6, a compensation transistor T7, and a storage capacitor Cst. In order to drive the light-emitting element 20 for light emission, the pixel circuit needs to receive scanning signals VSN1, VSN2, and VSP, a light-emitting control signal VEmit, a data signal Vdata, a reference signal VRef, an anode power voltage VPVDD, and a cathode power voltage VPVEE, each of needs to be transmitted via a signal line. Electrical connection among the thin film transistors and reception of each signal/voltage may be as shown in FIG. 5, and are not repeated in following description.

In FIG. 4, for conciseness, only two thin film transistors, TFTs, are depicted, and only an active layer (poly), a gate electrode (g), a source electrode (s), and a drain electrode (d) are depicted for each TFT. In practice, the TFT in the pixel circuit may be a low temperature polycrystalline (LTPS) TFT or an indium gallium zinc oxide (IGZO) TFT, and the IGZO TFT may have a bi-gate structure (including a bottom gate and a top gate). Specifics of the TFTs may depend on an actual situation. In addition, the capacitor Cst in the pixel circuit includes two plates.

As shown in FIGS. 4 and 5, the metal layer for each signal line in the array substrate 10 is not limited herein, as long as there is no short circuit between different signal lines.

It is taken as an example that the first signal line N1 serves as a data line for providing a data signal Vdata. In one embodiment, the first signal line N1 may be disposed in the metal layer M2, the metal layer M3, or the metal layer M4. In order to facilitate arrangement of the first auxiliary line D1 and the second auxiliary line D2 in the display region AA, a part of the first signal lines N1 may be disposed in the metal layer M4. In such case, the first segment DV1 in the first auxiliary line D1 and the third segment DV2 in the second auxiliary line D2 are also disposed in the metal layer M4, and the second segment DH1 in the first auxiliary line D1 and the fourth segment DH2 in the second auxiliary line D2 are disposed in the metal layer M3. The third segment DV2 in the metal layer M4 may be electrically connected to the cathode 23, and thereby the fourth segment DH2 in the metal layer M3 may be electrically connected to the cathode 23.

In one embodiment, the first signal line N1 may be disposed in the metal layer M3. In such case, the first segment DV1 of the first auxiliary line D1 and the third segment DV2 of the second auxiliary line D2 are also disposed in the metal layer M3, and the second segment DH1 in the first auxiliary line D1 and the fourth segment DH2 in the second auxiliary line D2 are disposed in the metal layer M4. The fourth segment DH2 in the metal layer M4 may be electrically connected to the cathode 23, and thereby the third segment DV2 in the metal layer M3 may be electrically connected to the cathode 23.

Reference is further made to FIG. 4. The second auxiliary line segment being electrically connected to the cathode 23 in the display region AA may be that the second auxiliary line segment is directly electrically connected to the cathode 23 in the display region AA, or that the second auxiliary line segment is indirectly electrically connected to the cathode 23 via an intermediate middle metal layer in the display region AA. For example, the third segment DV2 in the metal layer M4 may be electrically connected to the cathode 23 directly or indirectly, and the fourth segment DH2 in the metal layer M3 may be electrically connected to the cathode 23 directly or indirectly.

In summary, the first auxiliary line D1 for transmitting signals to the first signal line N1 is disposed in the display region AA of the display panel, and the first auxiliary line D1 includes at least one first auxiliary line segment. That is, wiring for transmitting signals to the first signal line N1 is arranged in the display region AA, which spares a dedicated space for such wiring and improves space utilization in the display panel. Furthermore, the second auxiliary line D2 is disposed in the display region AA, which improves uniformity of etching processing and reflection of the display panel. The second auxiliary line D2 is insulated from the first auxiliary line D1 and includes at least one second auxiliary line segment, and the second auxiliary line segment and the first auxiliary line segment are disposed in the same layer in the one-to-one correspondence. The second auxiliary line segment is electrically connected to the cathode(s) 23 in the display region to form parallel connection between the two, and the resistance of the cathode 23 is reduced. In one embodiment a voltage drop across the cathode 23 is reduced, a potential across the cathode 23 is more uniform. Thus, stability and uniformity of the cathode potential are improved among the different light-emitting elements, and display brightness is more consistent throughout the display panel.

Reference is further made to FIG. 3. In some embodiments, an orthographic projection of the third segments DV2 a reference plane, in which the array substrate 10 extends (or which is parallel to the array substrate 10), and an orthographic projection of the fourth segment DH2 on the reference plane are arranged as a grid. In other words, the orthographic projections of the two together form a grid. The third segment(s) DV2 and the fourth segment(s) DH2 are electrically connected in region(s) in which they overlap when viewed along a direction perpendicular to the reference plane. In one embodiment the third segment DV2 and the fourth segment DH2 are both electrically connected to the cathode 23, and the third segment DV2 and the fourth segment DH2 form a grid structure, which further reduces resistance of the cathode 23. The potential across the cathode is more uniform, uniformity and stability of the cathode potential of different light-emitting elements is improve, and hence the display brightness is more consistent throughout the display panel.

It is taken as an example that the first signal line N1 is disposed in the metal layer M4, the first segment DV1 and the third segment DV2 are disposed in the metal layer M4, and the second segment DH1 and the fourth segment DH2 are disposed in the metal layer M3. In such case, since the metal layer M4 is closer to the cathode 23 than the metal layer M3, it is convenient to connect the third segment DV2 electrically to the cathode 23. The fourth segment DH2 can be electrically connected to the cathode 23 via grid connection with the third segment DV2.

Hereinafter the third segment DV2 is taken as an example of the second auxiliary line segment on a basis of the third segment DV2 and the fourth segment DH2 forming the grid, in order to illustrate the connection between the second auxiliary line segment and the cathode 23 in detail. In such case, the first segment DV1 is the first auxiliary line segment, which is insulated from and disposed in the same layer as the third segment DV2 on the same layer.

Reference is further made to FIG. 4. The second auxiliary line segment (e.g., the third segment DV2) is located in the array substrate 10. There is at least the metal layer RE, in which the anode 21 is disposed, and the light-emitting functional layer 22 between the second auxiliary line segment and the cathode 23, even when the second auxiliary line segment is located in the metal layer M4. As a matter of fact, a planarization layer PLN at a side of the second auxiliary line segment facing the light-emitting element 20, and a pixel defining layer PDL between the anode 21 and the light-emitting functional layer 22, are also located between the second auxiliary line segment and the cathode 23. In FIG. 4, the light-emitting functional layer 22 is only depicted at a pixel opening K0 in the pixel defining layer PDL. In practice, the light-emitting functional layer 22 may be disposed throughout an entire surface, and the pixel defining layer PDL is located between the anode 21 and the light-emitting functional layer 22. Therefore, in a case that the second auxiliary line segment (e.g., the third segment DV2) is electrically connected to the cathode 23 directly, a through hole running from the light-emitting functional layer 22 to the planarization layer PLN is required. Such through hole has a large depth, which is apt to cause poor contact in the through hole, and is difficult to fabricate. In one embodiment, an opening the through hole at a side away from the array substrate 10 would be large, which increases spatial occupation.

Reference is further made to FIG. 4. In some embodiments, the display panel further includes an auxiliary electrode 30, which addresses the above issue. The auxiliary electrode 30 includes a transferring electrode 31. The transferring electrode 31 is disposed the display region AA, and is disposed between the second auxiliary line segment (e.g., the third segment DV2) and the cathode 23 along a direction perpendicular to the reference plane.

In the display region AA, the second auxiliary line segment (e.g., the third segment DV2) is electrically connected to the cathode 23 via the transferring electrode 31.

That is, in the display region AA, the second auxiliary line segment (e.g., the third segment DV2) is electrically connected to the cathode 23 indirectly via the intermediate metal layer (transferring electrode 31). In one embodiment a depth of a through hole connecting the transferring electrode 31 and the cathode 23 and a depth of a through hole connecting the transferring electrode 31 and the second auxiliary line segment (e.g., the third segment DV2) can be reduced. An electrical contact in the through holes is good, the through holes are easy to fabricate, and the opening of the through hole at the side away from the array substrate 10 can shrink to occupy smaller area.

Reference is further made to FIG. 4. In some embodiments, the transferring electrode 31 and the anode 21 are insulated from each other in the same layer. Since the metal layer RE in which the anode 21 is located is disposed between the second auxiliary line segment (e.g., the third segment DV2) and the cathode 23, the transferring electrode 31 is also disposed in the metal layer RE, and the second auxiliary line segment (e.g., the third segment DV2) is electrically connected to the cathode 23 in the display region AA via the transferring electrode 31.

As mentioned above, term "same layer" mentioned refers to layer structure(s) formed through that film(s) for a certain pattern are formed through a same filming process, and then patterned under the same mask through a same patterning process. Herein the anode 21 and the transferring electrode 31 may be fabricated in the same patterning process while being insulated from each other. In one embodiment manufacturing of the display panel is simplified.

Reference is further made to FIG. 4. In some embodiments, the transferring electrode 31 includes a first transferring electrode 31A. An orthographic projection of the first transferring electrode 31A on the reference plane overlaps at least partially with the orthographic projection of the second auxiliary line segment (e.g., the third segment DV2) on the reference plane. That is, at least a part of the first transferring electrode 31A is disposed right above the second auxiliary line segment (e.g., the third segment DV2) in the direction perpendicular to the reference plane.

Reference is further made to FIG. 4. In an embodiment, the array substrate 10 further includes the planarization layer PLN disposed on the side of the second auxiliary line segment (e.g., the third segment DV2) facing the light-emitting element 20. A first through hole K1 is provided in the planarization layer PLN, and the first transferring electrode 31A is electrically connected to the second auxiliary line segment (e.g., the third segment DV2) via the first through hole K1.

The display panel further includes a pixel defining layer PDL located between the anode 21 and the light-emitting functional layer 22. A second through hole K2 is provided in the pixel defining layer PDL, and the first transferring electrode 31A is electrically connected to the cathode 23 via the second through hole K2.

Reference is further made to FIG. 4. A pixel opening K0 is further provided in the pixel defining layer PDL, and the pixel openings K0 are in one-to-one correspondence to the light-emitting elements 20. The anodes 21 are exposed from the pixel openings K0, and the light-emitting functional layer 22 is electrically connected to the anodes 21 at the pixel openings K0. In FIG. 4, the light-emitting functional layer 22 is only depicted at the pixel openings K0 in the pixel defining layer PDL. In practice, the light-emitting functional layer 22 may be disposed to cover an entire surface, and the pixel defining layer PDL is located between the anode 21 and the light-emitting functional layer 22.

Each anode 21, the light-emitting functional layer 22 right above such anode 21, and the cathode 23 form one light-emitting element 20. The light-emitting element 20 may emit light due to a micro-cavity effect. Generally, reflectively of the anode 21 is required to be high.

Reference is further made to FIG. 4. The first transferring electrode 31A needs to extend from the first through hole K1 to the second through hole K2, to electrically connect the second auxiliary line segment (e.g., the third segment DV2) and the cathode 23. The first transferring electrode 31A also has high reflectivity since it is disposed in the same layer as the anode 21. Thus, orthographic projections of the first through holes K1 on reference plane and orthographic projections of the second through holes K2 on the reference plane may be arranged in an alternate manner, and an area of the orthographic projection of the first transferring electrode 31A on the reference plane can be small. Herein projections of two types of holes arranged in the alternate manner refer to that a projection of a hole of one type is adjacent to that of a corresponding hole of another type while they do not overlap. In one embodiment less external light are reflected by the first transferring electrode 31A, which weakens visibility inconsistency (i.e., display Mura effect) of the display panel.

In the pixel defining layer PDL, the second through holes K2 and the pixel openings K0 may be arranged in an alternate manner, for example, the second through hole K2 may be provided between adjacent pixel openings K0. In one embodiment the second through holes K2 have little effect on the pixel openings K0.

In one embodiment the cathode 23 may be electrically connected to the first transferring electrode 31A via the second through hole K2. In one embodiment, the cathodes 23 of all light-emitting elements 20 are connected to form a cathode layer SE. As shown in FIG. 4, the cathode layer SE covers side walls and a bottom of the second through hole K2 completely, and thereby is electrically connected to the first transferring electrodes 31A. In one embodiment, the cathodes 23 of at least two light-emitting elements 20 may be independently disposed. The independent cathode 23 may cover the side walls and the bottom of the corresponding second through hole K2 completely, and hence is electrically connected to the corresponding first transferring electrode 31A. The independent cathode 23 may In one embodiment cover the side walls of the second through hole K2 but not cover the bottom of the second through hole K2 completely, when electrically connecting the first transferring electrode 31A. A specific implementation may depend on an actual situation.

Figure 6:
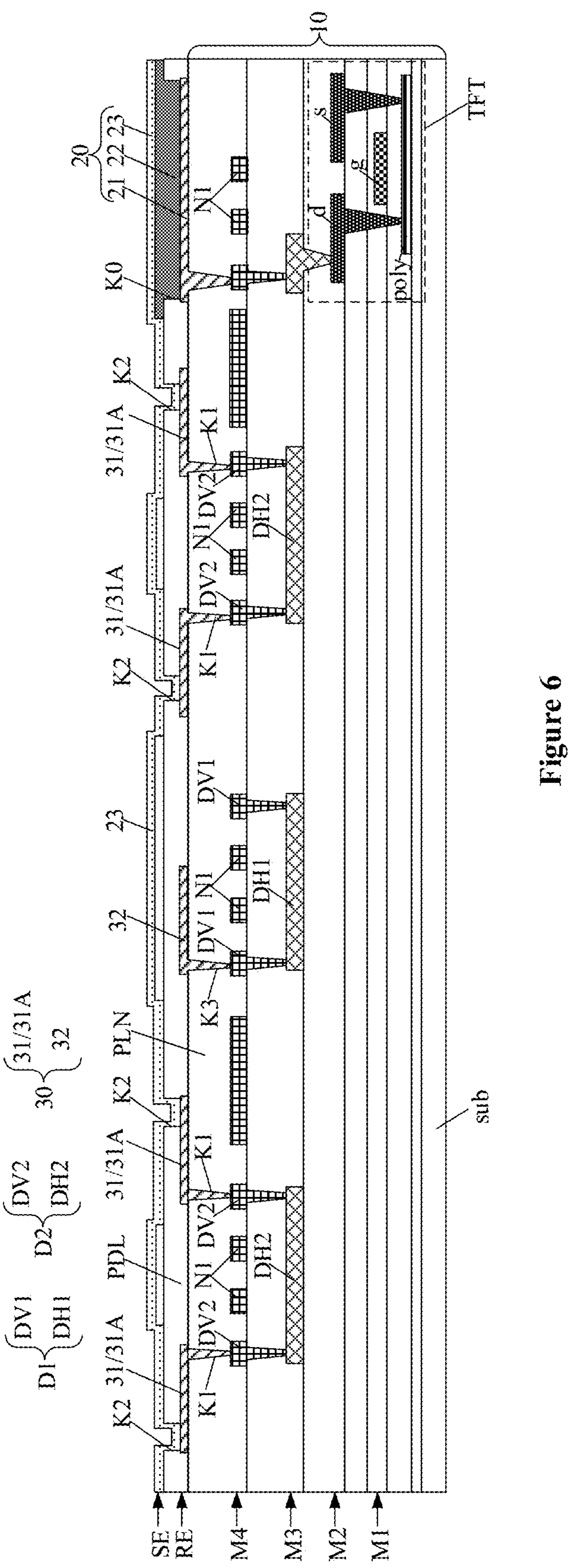
FIG. 6 is a schematic cross-sectional view of a display panel according to another embodiment of the present disclosure.
Figure 7:
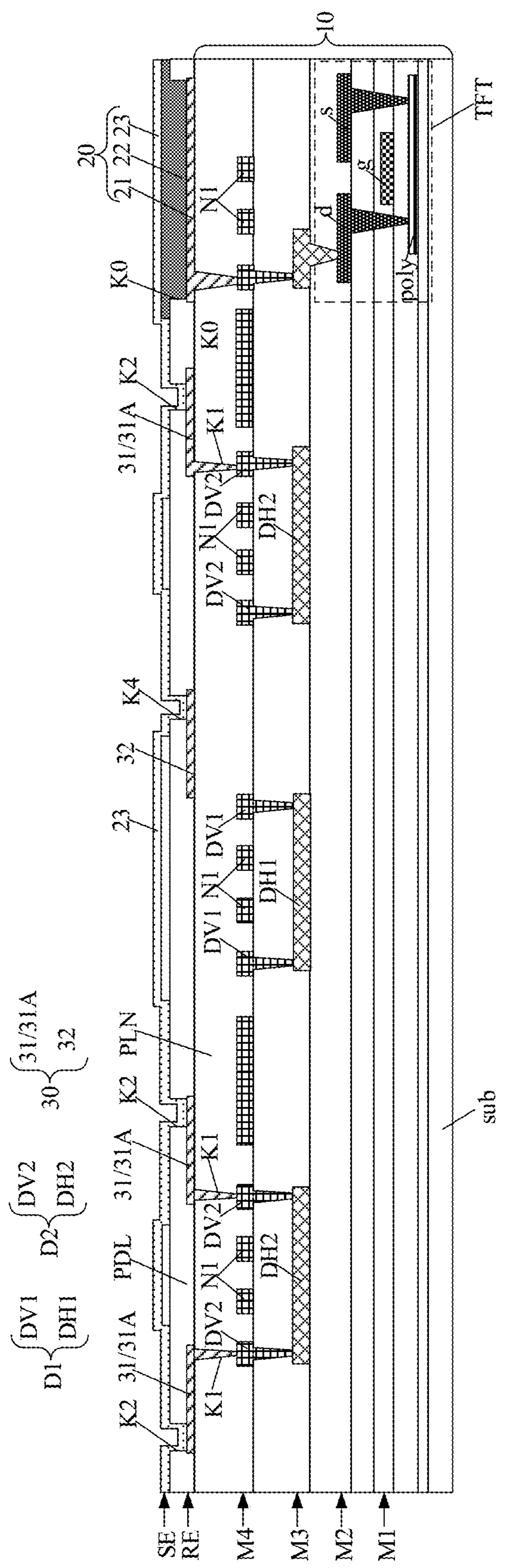
FIG. 7 is a schematic cross-sectional view of a display panel according to another embodiment of the present disclosure.

Reference is further made to FIGS. 6 and 7. In an embodiment, the auxiliary electrode 30 further includes a non-transferring electrode 32, which can further reduce visibility inconsistency of the display panel. The non-transferring electrode 32, the first transferring electrode 31A, and the anode 21 are disposed in the same layer and insulated from each other. The non-transferring electrode 32 is disposed in the display region AA, and an orthographic projection of the non-transferring electrode 32 on the reference plane overlaps at least partially with the orthographic projection of the first auxiliary line segment (e.g., the first segment DV1) on the reference plane.

Reference is further made to FIGS. 4, 6, and 7. The orthographic projection of the first transferring electrode 31A on the reference plane overlaps at least partially with the orthogonal projection of the second auxiliary line segment (e.g., the third segment DV2) on the reference plane. That is, at least a part of the first transferring electrode 31A is disposed right above the second auxiliary line segment (e.g., the third segment DV2) when viewed along the direction perpendicular to the reference plane, and the first transferring electrode 31A can be electrically connected to the second auxiliary line segment (e.g., the third segment DV2) via the first through hole K1 in the planarization layer PLN and electrically connected to the cathode 23 via the second through hole K2 in the pixel defining layer PDL. As shown in FIGS. 6 to 7, the orthographic projection of the non-transferring electrode 32 on the reference plane overlaps at least partially with the orthographic projection of the first auxiliary line segment (e.g., the first segment DV1) on the reference plane. That is, at least a part of the non-transferring electrode 32 is disposed right above the first auxiliary line segment (e.g., the first segment DV1) when viewed along the direction perpendicular to the reference plane. In one embodiment, a relative positional relationship between the non-transferring electrode 32 and the first auxiliary line segment (e.g., the first segment DV1) is identical to the relative position relationship between the first transferring electrode 31A and the second auxiliary line segment (e.g., the third segment DV2).

As shown in FIG. 3, in the display region AA, the first auxiliary line segment (e.g., the first segment DV1) is insulated from the second auxiliary line segment (e.g., the third segment DV2) in the same layer, and is configured to transmit signals to the first signal line N1. Therefore, the non-transferring electrode 32 disposed above the first auxiliary line segment (e.g., the first segment DV1) should not connect the first auxiliary line segment electrically to the cathode 23, otherwise the first auxiliary line segment (e.g., the first segment DV1) is short-circuited to the cathode 23.

Reference is further made to FIGS. 4, 6, and 7. In the metal layer RE in which the anode 21 is located, the first transferring electrode 31A may be disposed in a region corresponding to the second auxiliary line segment (e.g., the third segment DV2), and the second auxiliary line segment can be electrically connected to the cathode 23 via the first transferring electrode 31A, and the non-transferring electrode 32 may be disposed in a region corresponding to the first auxiliary line segment (e.g., the first segment DV1). Unlike the first transferring electrode 31A, the non-transferring electrode 32 should not connect the first auxiliary line segment (e.g., the first segment DV1) electrically to the cathode 23.

In one embodiment the non-transferring electrode 32 is provided in the metal layer RE in which the anode 21 and the first transferring electrode 31A are located, and the orthographic projection of the non-transferring electrode 32 on the reference plane overlaps at least partially with the orthographic projection of the first auxiliary line segment (e.g., the first segment DV1) on the reference plane. In one embodiment the relative position relationship between the non-transferring electrode 32 and the first auxiliary line segment DV1 (e.g., the first segment DV1) may be configured as identical to that between the first transferring electrode 31A and the second auxiliary line segment (e.g., the third segment DV2). Different regions of the metal layer RE are subject smaller variation in reflectivity with respect to external light, which further weakens visibility inconsistency of the display panel. Here the non-transferring electrode 32 does not connect the first auxiliary line segment (e.g., the first segment DV1) electrically to the cathode 23.

As mentioned above, term "same layer" mentioned refers to layer structure(s) formed through that film(s) for a certain pattern are formed through a same filming process, and then patterned under the same mask through a same patterning process. Herein the anode 21, the first transferring electrode 31A, and the non-transferring electrode 32 may be fabricated in the same patterning process while being insulated from each other. In one embodiment manufacturing of the display panel is simplified.

Hereinafter described are different embodiments in which the non-transferring electrode 32 does not connect the first auxiliary line segment (e.g., the first segment DV1) electrically to the cathode 23.

Reference is further made to FIG. 6. In some embodiments, a third through hole K3 is provided in the planarization layer PLN, and the non-transferring electrode 32 is electrically connected to the first auxiliary line segment (e.g., the first segment DV1) via the third through hole K3. That is, the first transferring electrode 31A is electrically connected to the second auxiliary line segment (e.g., the third segment DV1) via the first through hole K1, while the non-transferring electrode 32 is electrically connected to the first auxiliary line segment (e.g., the first segment DV1) via the third through hole K3. A relative position relationship among the non-transferring electrode 32, the third through hole K3, and the first auxiliary line segment DV1 (e.g., the first segment DV1) may be identical to that among the first transferring electrode 31A, the first through hole K1, and the second auxiliary line segment (e.g., the third segment DV2). Accordingly, the auxiliary electrode(s) 30 are uniformly distributed in the display region AA, that is, the first transferring electrode(s) 31A and the non-transferring electrode (s) 32 as a whole are uniformly distributed in the display region AA, and the first through holes K1 and the third through holes K3 are also uniformly distributed in the display region AA. In one embodiment different regions of the metal layer RE are subject to smaller variation in reflectivity with respect to external light, which further weakens the visibility inconsistency of the display panel. Uniformity of display, etching processing, and reflection of the display panel are improved.

As shown in FIG. 6, the non-transferring electrode(s) 32 and the cathode(s) 23 are isolated by the pixel defining layer PDL, that is, the non-transferring electrode(s) 32 and the cathode 23(*s*) are insulated. In such case, the orthographic projection of the non-transferring electrode 32 on the reference plane is located within the orthographic projection of the pixel defining layer PDL on the reference plane.

Reference is further made to FIG. 7. In other embodiments, a fourth through hole K4 is further provided in the pixel defining layer PDL, and the non-transferring electrode 32 is electrically connected to the cathode 23 via the fourth through hole K4. That is, not only the second auxiliary line segment (e.g., the third segment DV1) is electrically connected to the cathode 23 via the first transferring electrode 31A, but also the non-transferring electrode 23 is electrically connected to the cathode 23 via the fourth through hole K4. In one embodiment the resistance of the cathode 23 is further reduced, which reduces the voltage drop across the cathode and improve uniformity of the potential across the cathode. Uniformity and stability of the cathode potential of different light-emitting elements are improved, and thus display brightness is more consistent throughout the display panel. Here the auxiliary electrode(s) 30 may be distributed uniformly in the display region AA. That is, both the first transferring electrode(s) 31A and the non-transferring electrode(s) 32 as a whole are distributed uniformly in the display region AA, and the second through holes K2 and the fourth through holes K4 are distributed uniformly in the display region AA. In one embodiment different regions of the metal layer RE are subject to smaller variation in reflectivity with respect to external light, which further weakens the visibility inconsistency of the display panel. Uniformity of display, etching processing, and reflection of the display panel are improved.

As shown in FIG. 7, the non-transferring electrode 32 and the first auxiliary line segment (e.g., the first segment DV1) are isolated by the planarization layer PLN. That is, the non-transferring electrode 32 is insulated from the first auxiliary line segment (e.g., the first segment DV1).

Reference is made to FIG. 6 in conjunction with FIG. 7. In other embodiments, the third through hole K3 is further provided in the planarization layer PLN, and the fourth through hole K4 is further provided in the pixel defining layer PDL.

A part of the non-transferring electrodes 32 is electrically connected to the first auxiliary line segment(s) (e.g., the first segment DV1) via the third through hole(s) K3, and such part of the non-transferring electrodes 32 and the cathode(s) 23 are isolated by the pixel defining layer PDL. That is, such part of the non-transferring electrode 32 is insulated from the cathode(s) 23.

Another part of the non-transferring electrode 32 is electrically connected to the cathode(s) 23 via the fourth through hole(s) K4, and the other part of the non-replacement electrode 32 and the first auxiliary line segment(s) (e.g., the first segment DV1) are isolated by the planarization layer PLN. That is, the other part of the non-transferring electrode 32 is insulated from the first auxiliary line segment(s) (e.g., the first segment DV1).

In one embodiment not only the second auxiliary line segment(s) (e.g., the third segment DV1) is electrically connected to the cathode(s) 23 via the first transferring electrode(s) 31A, but also a part of the non-transferring electrodes 32 is electrically connected to the cathode(s) 23 via the fourth through hole(s) K4, which further reduces the resistance of the cathode 23. The resistance of the cathode 23 is further reduced, which reduces the voltage drop across the cathode and improve uniformity of the potential across the cathode. Uniformity and stability of the cathode potential of different light-emitting elements are improved, and thus display brightness is more consistent throughout the display panel.

In one embodiment, the auxiliary electrode(s) 30 may be distributed uniformly in the display region AA. That is, both the first transferring electrode(s) 31A and the non-transferring electrode(s) 32 as a whole are distributed uniformly in the display region AA. In one embodiment different regions of the metal layer RE are subject to smaller variation in reflectivity with respect to external light, which further weakens the visibility inconsistency of the display panel. Uniformity of display, etching processing, and reflection of the display panel are improved.

In some embodiments, the non-transferring electrode 32 may further be disposed above the first auxiliary line segment (e.g., the first segment DV1). The non-transferring electrode 32 and the cathode 23 are isolated by the pixel defining layer PDL, and the non-transferring electrode 32 and the first auxiliary line segment (e.g., the first segment DV1) are isolated by the planarization layer PLN. That is, the non-transferring electrode 32, the cathode 23, and the first auxiliary line segment (e.g., the first segment DV1) are insulated from each other. In such case, the auxiliary electrode(s) 30 may be also distributed uniformly in the display region AA. That is, both the first transferring electrode(s) 31A and the non-transferring electrode(s) 32 as a whole are distributed uniformly in the display region AA. Different regions of the metal layer RE are also subject to smaller variation in reflectivity with respect to external light, which further improves uniformity of display, etching processing, and reflection of the display panel.

Figure 8:
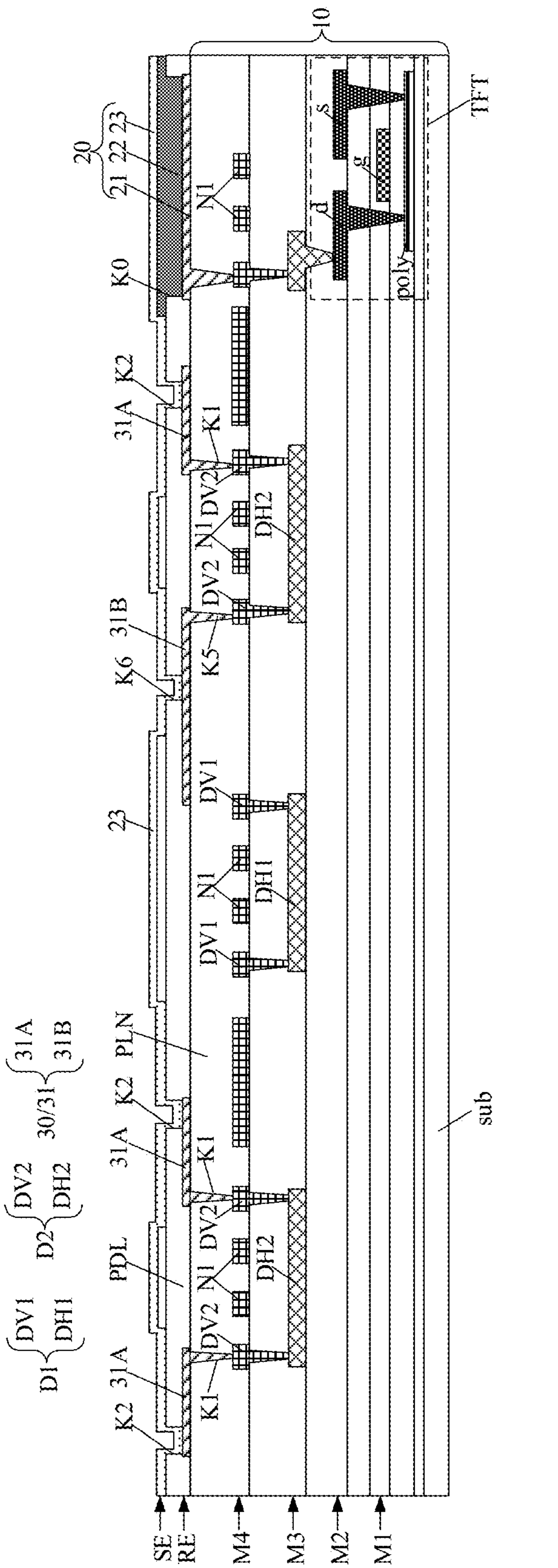
FIG. 8 is a schematic cross-sectional view of a display panel according to another embodiment of the present disclosure.

Reference is made to FIG. 8. In some embodiments, the transferring electrode 31 further includes a second transferring electrode 31B besides the first transferring electrode 31A, of which a part is disposed right above the second auxiliary line segment (e.g., the third segment DV2). An orthographic projection of the second transferring electrode 31B on the reference plane overlaps at least partially with the orthographic projection of the first auxiliary line segment (e.g., the first segment) on the reference plane. That is, the second transferring electrode 31B is similar to the non-transferring electrode 32 in the foregoing embodiment as shown in FIG. 7. The second transferring electrode 31B is disposed above the first auxiliary line segment (e.g., the first segment DV1) along the direction perpendicular to the reference plane. Differing from the non-transferring electrode 32, the second transferring electrode 31B above the first segment (e.g., the first segment DV1) is not only electrically connected to the cathode 23, but also extends to a position above the second auxiliary line segment (e.g., the third segment DV2) to connect second auxiliary line segment (e.g., the third segment DV2) electrically.

Reference is further made to FIG. 8. In an embodiment, a fifth through hole K5 is provided in the planarization layer PLN, and the second transferring electrode 31B is electrically connected to the second auxiliary line segment (e.g., the third segment DV2) via the fifth through hole K5. In one embodiment, a sixth through hole K6 is provided in the pixel defining layer PDL, and the second transferring electrode 31B is electrically connected to the cathode 23 via the sixth through hole K6.

In one embodiment the first transferring electrode 31A is located above the second auxiliary line segment (e.g., the third segment DV3) and is electrically connected to the cathode 23 via the second through hole K2, and the second transferring electrode 31B is located above the first auxiliary line segment (e.g., the first segment DV1) and is electrically connected to the cathode 23 via the fifth through hole K5. The second through holes K2 and the fifth through holes K5 as a whole may be distributed uniformly in the display region AA, which can improve uniformity of etching processing and reflection of the display panel.

As shown in FIG. 8, the second transferring electrode 31B is located above the first auxiliary line segment (e.g., the first segment DV1), and the second transferring electrode 31B needs to extend (e.g., wind) in the metal layer RE until reaching the position above the second auxiliary line segment (e.g., above the third segment DV2). In one embodiment the second transferring electrode 31B can be electrically connected to the second auxiliary line segment (e.g., the third segment DV2) via the fifth through hole K5 in the planarization layer PLN. In such case, the orthographic projection of the first transferring electrode 31A on the reference plane needs to overlap at least partially with the orthographic projection of the second auxiliary line segment (e.g., the third segment DV2) on the reference plane, while the orthographic projection of the second transferring electrode 31B on the reference plane needs to overlaps at least partially with not only the orthographic projection of the first auxiliary line segment (e.g., the first segment DV1) on the reference plane but also the orthographic projection of the second auxiliary line segment (e.g., the third segment DV2) on the reference plane. Hence, an area of the orthographic projection of the second transferring electrode 31B on the reference plane may be larger than an area of the orthographic projection of the first transferring electrode 31A on the reference plane.

Although the area of the orthographic projection of the second transferring electrode 31B on the reference plane may be larger than that of the first transferring electrode 31A on the reference plane, the overall auxiliary electrode(s) 30 (that is, the first transferring electrode 31A and the second transferring electrode 31B as a whole) can still be distributed substantially uniformly in the display region AA. In one embodiment different regions of the metal layer RE are subject to smaller variation in reflectivity with respect to external light, which further weakens the visibility inconsistency of the display panel. Uniformity of display, etching processing, and reflection of the display panel are improved.

In summary, the auxiliary electrode 30 may be configured in following manners. In a first manner, the non-transferring electrode 32 is disposed above the first auxiliary line segment (e.g., the first segment DV1). The non-transferring electrode 32 may be electrically connected to the cathode 23 via the through hole in the pixel defining layer PDL and insulated from the first auxiliary line segment (e.g., the first segment DV1). In one embodiment, the non-transferring electrode 32 may be electrically connected to the first auxiliary line segment (e.g., the first segment DV1) via the through hole in the planarization layer PLN and insulated from the cathode 23. In one embodiment, the non-transferring electrode 32 may be insulated from both the cathode 23 and the first auxiliary line segment (e.g., the first segment DV1), and is also insulated from the second auxiliary line segment (e.g., the third segment DV2). That is, in the last case, the non-transferring electrode 32 is "just disposed" in the metal layer RE, and is insulated from the cathode 23, the first auxiliary line segment, and the second auxiliary line segment. In a second manner, the second transferring electrode 31B is disposed above the first auxiliary line segment (e.g., the first segment DV1), and the second transferring electrode 31B is electrically connected to the cathode 23 via the through hole in the pixel defining layer PDL. The second transferring electrode 31B in the metal layer RE extends to the position above the second auxiliary line segment (e.g., the third segment DV2), and thereby is electrically connected to the second auxiliary line segment (e.g., the third segment DV2) via the through hole in the planarization layer PLN. All the above manners are capable to provide overall uniform distribution of the auxiliary electrodes 30 throughout the display region AA. In one embodiment different regions of the metal layer RE are subject to smaller variation in reflectivity with respect to external light, which further weakens the visibility inconsistency of the display panel. Uniformity of display, etching processing, and reflection of the display panel are improved.

As disclosed above, the second transferring electrode 31B is electrically connected to the cathode 23 via the through hole in the pixel defining layer PDL, and extends in the metal layer RE to the position above the second auxiliary line segment (e.g., the third segment DV2). The second transferring electrode 31B is further electrically connected to the second auxiliary line segment (e.g., the third segment DV2) via the through hole in the planarization layer PLN, and the orthographic projection of the second transferring electrode 31B on the reference plane is larger than the orthogonal projection of the first transferring electrode 31A on the reference plane. The smaller a length of the second transferring electrode 31B is, the more uniform the second transferring electrode(s) 31B and the first transferring electrode(s) 31A are distributed in the display region AA, and the smaller variation in reflectivity the different regions of the metal layer RE are subject to with respect to external light.

On such basis, reference is further made to FIG. 3. In some embodiments, the first auxiliary line segments (e.g., the first segment DV1) extend along the first direction (e.g., the Y direction), and are sequentially arranged along the second direction (e.g., the X direction). The first direction (e.g., the Y direction) and the second direction (e.g., the X direction) are both parallel to the reference plane, and the first direction (e.g., the Y direction) is not parallel with the second direction (e.g., the X direction). The second auxiliary line segments (e.g., the third segment DV2) also extend along the first direction (e.g., the Y direction), and are sequentially arranged along the second direction (e.g., X direction).

Reference is further made to FIG. 8. An orthographic projection of at least a part of the second auxiliary line segment (e.g., the third segment DV2) on the reference plane overlaps with an orthographic projection of the fifth through hole K5 on the reference plane. In one embodiment, the fifth through hole K5 is a through hole in the planarization layer PLN that connects the second auxiliary line segment (e.g., the third segment DV2) and the second transferring electrode 31B.

Figure 9:
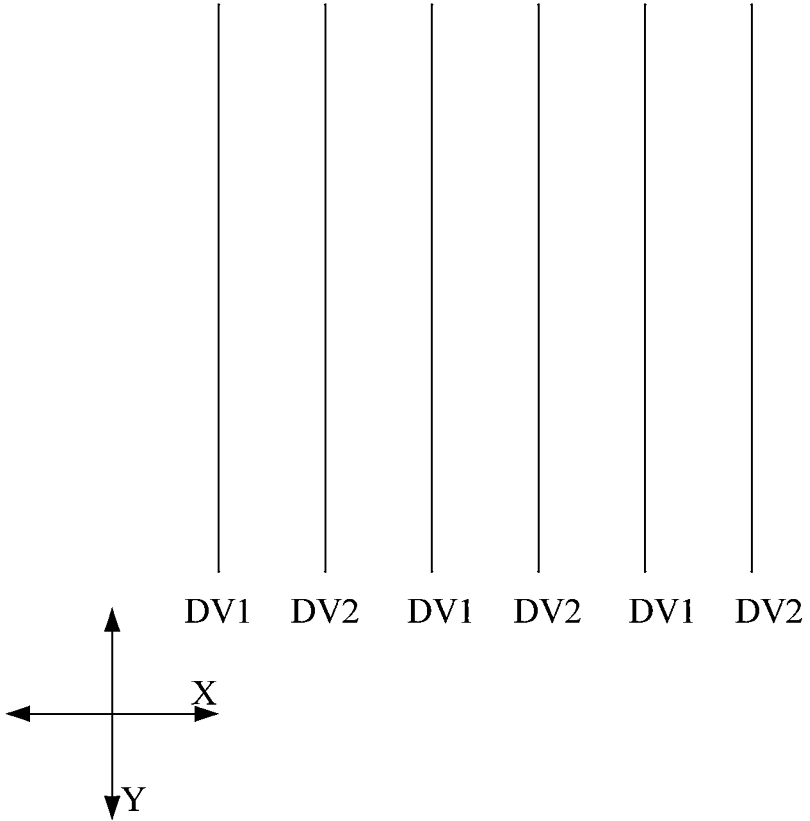
FIG. 9 is a schematic diagram of arrangement of first segments and third segments in a display panel according to an embodiment of the present disclosure.

Reference is made to FIG. 9. In one embodiment, the first auxiliary line segments (e.g., the first segments DV1) and the second auxiliary line segments (e.g., the third segments DV2) are arranged alternately along the second direction (e.g. the X direction).

In one embodiment both the first auxiliary line segments (e.g., the first segments DV1) and the second auxiliary line segments (e.g., the third segments DV2) extend along the first direction (e.g., the Y direction) and are sequentially arranged along the second direction (e.g., the X direction), and the first auxiliary line segments (e.g., the first segments DV1) and the second auxiliary line segments (e.g., the third segments DV2) are alternately arranged along the second direction (e.g., the X direction). As discloses above, the second transferring electrode 31B is electrically connected to the cathode 23 via the sixth through hole K6 in the pixel defining layer PDL, and is isolated from the first auxiliary line segment (e.g., the first segment DV1) by the planarization layer PLN. Hence, the second transferring electrode 31B only needs to extend for a short distance in the metal layer RE to connect the second auxiliary line segment (e.g., the third segment DV2) electrically via the fifth through hole K5 in the planarization layer PLN. The second transferring electrodes 31B and the first transferring electrodes 31A as a whole are thus distributed more uniformly in the display region AA. Different regions of the metal layer RE are subject to smaller variation in reflectivity with respect to external light, which further weakens the visibility inconsistency of the display panel. Uniformity of display, etching processing, and reflection of the display panel are improved.

The second transferring electrode 31B is electrically connected to the second auxiliary line segment (e.g., the third segment DV2) via the fifth through hole K5 in the planarization layer PLN. That is, the orthographic projection of the second auxiliary line segment (e.g., the third segment DV2) on the reference plane overlaps at least partially with the orthographic projection of the fifth through hole K5 on the reference plane. In one embodiment, the first auxiliary line segments (e.g., the first segments DV1) and the second auxiliary line segments (e.g., the third segments DV2) are alternately arranged along the second direction (e.g., the X direction). That is, the first auxiliary line segments (e.g., the first segment DV1) and the fifth through holes K5 are arranged alternately along the second direction (e.g., the X direction).

In the foregoing embodiments, it is taken as an example that both the first auxiliary line segments (e.g., the first segments DV1) and the second auxiliary line segments (e.g., the third segment DV2) extend along the first direction (e.g., the Y direction) and are sequentially arranged along the second direction (e.g., the X direction). In an alternative embodiment, the second transferring electrode 31B is electrically connected to the cathode 23 via the through hole in the pixel defining layer PDL, and extends in the metal layer RE to the position above the second auxiliary line segment (e.g., the fourth segment DH2), and the second transferring electrode 31B is electrically connected to the second auxiliary line segment (e.g., the fourth segment DH2) via the through hole in the planarization layer PLN. Both the first auxiliary line segments (e.g., the second segments DH1) and the second auxiliary line segments (e.g., the fourth segments DH2) may extend along the first direction (e.g., the X direction) and be sequentially arranged along the second direction (e.g., the Y direction). In such case, the first auxiliary line segments (e.g., the second segments DH1) and the second auxiliary line segments (e.g., the fourth segment DH2) are alternately arranged along the second direction (e.g., the Y direction), to shorten a distance for which the second transferring electrode 31B extends in the metal layer RE.

Figure 10:
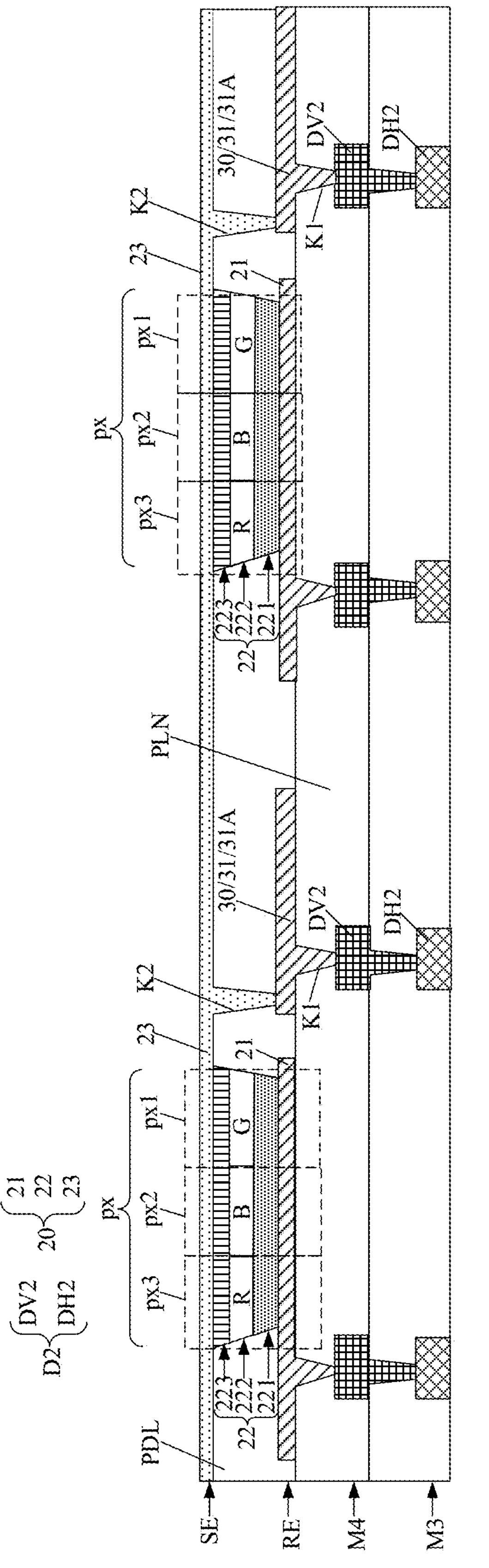
FIG. 10 is a schematic cross-sectional view of a display panel according to another embodiment of the present disclosure.

FIG. 10 shows a schematic diagram of a partial cross section of a display panel according to another embodiment of the present disclosure. As shown in FIG. 10, the display panel further includes multiple pixel units px, which are arranged in an array. The auxiliary electrodes 30 are in one-to-one correspondence to the pixel units px.

The pixel unit px includes at least a first sub-pixel px1. An orthographic projection of the auxiliary electrode 30 on the reference plane is adjacent to an orthographic projection of the first sub-pixel px1 on the reference plane.

Reference is made to FIG. 10. The light-emitting element 20 includes an anode 21, a light-emitting functional layer 22, and a cathode 23. The light-emitting functional layer 22 includes a light-emitting layer 222, a first conducting layer 221 disposed between the light-emitting layer 221 and the anode 21, and a second conducting layer 223 disposed between the light-emitting layer 221 and the cathode 23. The first conducting layer 221 may be a common layer shared among all light-emitting elements 20, and the second conducting layer 223 may be another common layer shared among all light-emitting elements 20. The light-emitting layer 222 is independent in each light-emitting element 20, and is configured to emit light of a corresponding primary color. One light-emitting element 20 may correspond to one sub-pixel.

Reference is further made to FIG. 10. The multiple pixel units px arranged in the array may include at least one sub-pixel. In one embodiment, the pixel units px include a first sub-pixel px1, a second sub-pixel px2, and a third sub-pixel px3, which are configured to synthesize different colors. The light-emitting layers of the first sub-pixel px1, the second sub-pixel px2, and the third sub-pixel are configured to emit green (G), blue (B), and red (R), respectively.

As disclosed above, the auxiliary electrode 30 may include the transferring electrode 31 and the non-transferring electrode 32, the transferring electrode 31 is electrically connected to the second auxiliary line segment (e.g., the third segment DV2) and the cathode 23, while the non-transferring electrode 32 is insulated from the second auxiliary line segment (e.g., the third segment DV2) and/or insulated from the cathode 23. The orthographic projection of the auxiliary electrode 30 on the reference plane being adjacent to the orthographic projection of the first sub-pixel px1 on the reference plane may be implemented as follows. In a first manner, the orthographic projection of the transferring electrode 31 on the reference plane is adjacent to the orthographic projection of the first sub-pixel px1 on the reference plane. In a second manner, the orthographic projection of the non-transferring electrode 32 on the reference plane is adjacent to the orthographic projection of the first sub-pixel px1 on the reference plane. In a third manner, both the orthographic projection of the transferring electrode 31 on the reference plane and the orthographic projection of the non-transferring electrode 32 on the reference plane are adjacent to the orthographic projection of the first sub-pixel px1 on the reference plane.

As discloses above, the auxiliary electrode 30 is located in the metal layer RE and has high reflectivity. In one embodiment, the auxiliary electrodes 30 are in one-to-one correspondence to the pixel units px, and the orthographic projection of the auxiliary electrode 30 on the reference plane is adjacent to the orthographic projection of the corresponding first sub-pixel px1 on the reference plane. The first sub-pixel px1 may be configured to emit a color to which the human eye is more sensitive, or may have stronger luminescence. In one embodiment when viewing the display panel, a user tends to focus on first sub-pixels px1 and hence ignore the external light reflected by the auxiliary electrode 30, which improves user experience. Since human eyes are sensitive to green, the first sub-pixel px1 may be a green sub-pixel in some embodiments. That is, the orthographic projection of the auxiliary electrode 30 on the reference plane is adjacent to the orthographic projection of the green sub-pixel px1 on the reference plane. In such case, the second sub-pixel px2 may be a blue sub-pixel, and the third sub-pixel px3 may be a red sub-pixel. It is appreciated that the first sub-pixel px1 may emit another color to which human eyes are more sensitive, or may be another sub-pixel having higher stronger luminescence.

In the foregoing embodiments, it is taken as a main example that the third segment DV2 serves as the second auxiliary line segment and is disposed in the metal layer M4, when illustrating electrical connection between the second auxiliary line segment and the cathode 23. In other embodiments, the second auxiliary line segment may include a fourth segment DH2 disposed in the metal layer M3. The fourth segment DH2 may be electrically connected to the cathode 23 directly, or indirectly via an intermediate metal layer, in the display region AA. In some embodiments, the third segment DV2 and the fourth segment DH2 may both be electrically connected to the cathode 23 in the display region AA. Details of electrical connection between the fourth segment DH2, or another segment in the at least one second auxiliary line segment D2, and the cathode 23 may refer to those of the electrical connection between the third segment DV2 and the cathode 23, and are not repeated herein.

In the second auxiliary line D2, segment(s) located in only one metal layer may be electrically connected to the cathode 23 in the display region AA, or segments located in multiple metal layers may be electrically connected to the cathode 23 in the display region AA, which is not limited herein.

Figure 11:
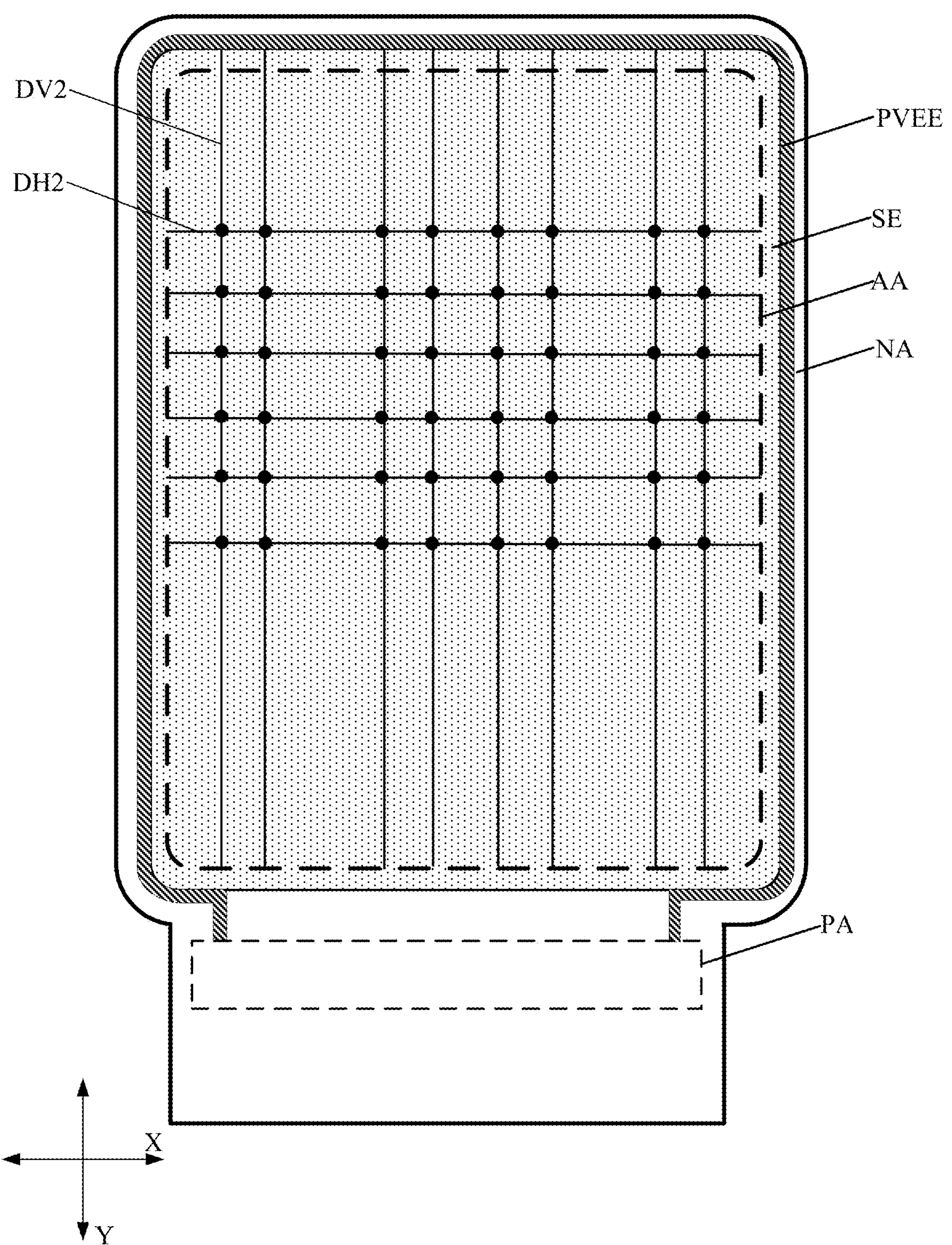
FIG. 11 is a schematic top view of a display panel according to another embodiment of the present disclosure.

Reference is made to FIGS. 4, 6-8, and 10. In some embodiments, the cathodes 23 of all light-emitting elements are connected to form the cathode layer SE. FIG. 11 shows a schematic top view of a display panel according to an embodiment of the present disclosure. As shown in FIG. 11, an orthographic projection of the display region AA on the reference plane is located within an orthographic projection of the cathode layer SE on the reference plane. In such case, the cathode layer SE covers the entire surface, and hence it may be fabricated through evaporation under a common metal mask (CMM).

On such basis, reference is made to FIGS. 3 and 11. In an embodiment, the display panel further includes a non-display region NA, which surrounds the display region AA at least partially (i.e., neighbor on at least a part of a periphery of the display region AA).

The array substrate 10 may further include a first power voltage line PVEE. The first power voltage line PVEE is disposed in the non-display region NA and surrounds the display region AA at least partially. The first power voltage line PVEE is electrically connected to the cathode layer SE in the non-display region NA.

Figure 12:
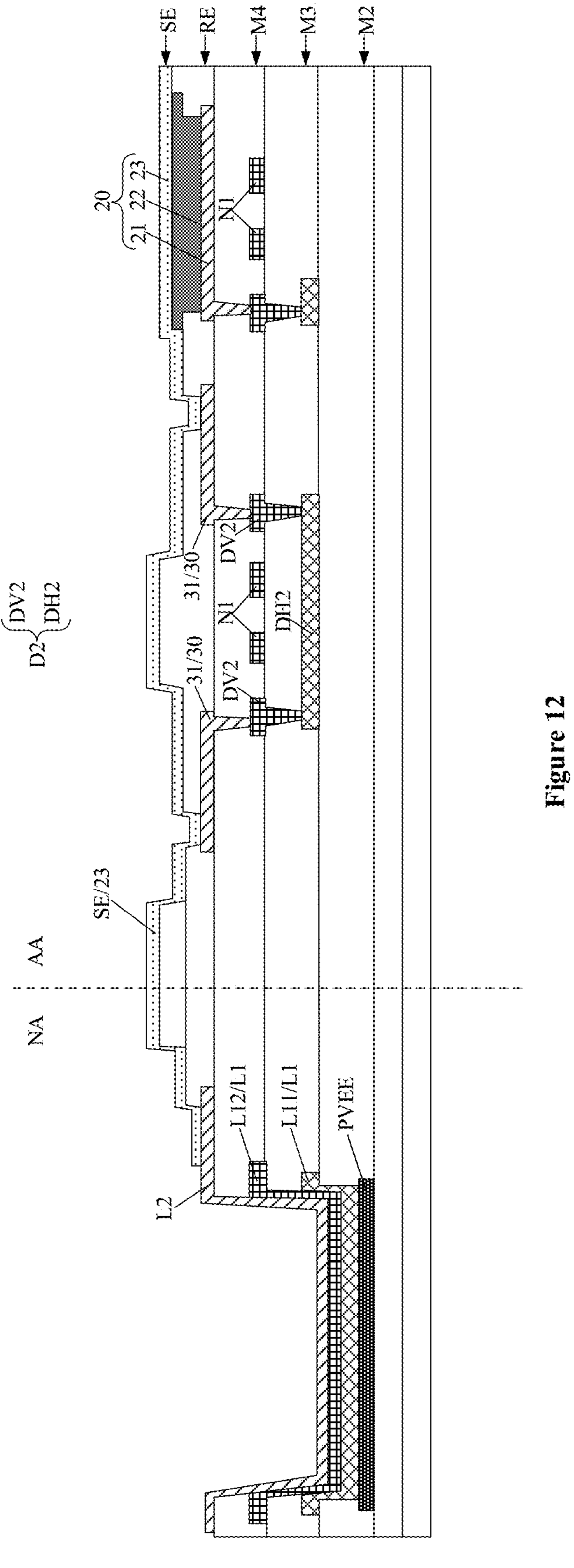
FIG. 12 is a schematic cross-sectional view of a display panel according to another embodiment of the present disclosure.

Reference is made to FIG. 12. In one embodiment, the first power voltage line PVEE may be disposed in the metal layer M2.

Reference is further made to FIG. 12. In one embodiment, the first power voltage line PVEE may be led out from the pad region PA, and is overlaid with the cathode layer SE at an upper left or upper right portion of a frame in the non-display region NA around the display region AA. The present disclosure is not limited to the above case. As shown in FIG. 3, the first power voltage line PVEE may be In one embodiment overlaid the cathode layer SE at a left or right portion of the frame around the display region AA, or even overlaid with the cathode layer SE at a lower portion of the frame of display region AA. The first power voltage line PVEE in the non-display region NA around the display region AA being narrow and/or short facilitates a narrow-frame design of the display panel.

Reference is made to FIG. 4 in conjunction with FIG. 11. A current flows from the anode 21, via the light-emitting functional layer 22, to the cathode layer SE of the light-emitting element 20, and then reaches the first power voltage line PVEE. Thus, a voltage drop is mostly induced by the cathode layer SE. Since the cathode layer SE is disposed at a light-emitting side, its light transmittance is required to be high, and hence a thickness of the cathode layer SE should be small enough, which results in large resistance of the cathode layer SE. Hence, there is a large voltage drop across the cathode layer SE, and a potential across the cathode layer SE is non-uniform. The cathode potentials at different light-emitting elements are subject to large variation, and thus display brightness is inconsistent. In one embodiment, there is another voltage drop on the first power voltage line PVEE, especially that the first power voltage line PVEE is long at a side of IC and at a side opposite to the IC, which further exacerbate the inconsistency in display brightness.

Herein the at least one second auxiliary line segment (e.g., the third segment DV2 and the fourth segment DH2) in the second auxiliary line D2 is connected in parallel with the cathode layer SE in the display region AA, which reduces the voltage drop across the cathode layer SE and render the potential across the cathode layer SE more uniform. In one embodiment the cathode potentials at different light-emitting elements are more uniform, and the uniformity the display brightness is more consistent. In one embodiment, since the resistance of the cathode layer SE is reduced, a width of the first power voltage line PVEE can be reduced, which facilitates narrowing of the frame of the display panel. In such case, the decreased resistance of the cathode layer SE can compensate increased resistance of the first power voltage line PVEE caused by the smaller width, and thus there may be no negative impact on the cathode potential across the cathode layer SE.

In FIG. 11, only a few of the third segments DV2 extending along the Y direction and a few of the fourth segments DH2 extending along the X direction are depicted for the sake of conciseness. Arrangement of the third segments DV2 and the fourth segments DH2 may refer to FIG. 3.

Hereinafter illustrated is how the first power voltage line PVEE is electrically connected to the cathode layer SE in the non-display region NA.

Reference is made to FIG. 12. In some embodiments, the display panel further includes a first connecting part (layer) L1 and a second connecting part (layer) L2, which are disposed in the non-display region NA. The first connecting part L1 and the first auxiliary line segment are insulated from each other and disposed in the same layer, and the second connecting part L2 and the anode 21 are insulated from each other and disposed in the same layer.

The first power voltage line PVEE is electrically connected to the cathode layer SE sequentially via the first connecting part L1 and the second connecting part L2 in the non-display region NA.

As discloses above, the first auxiliary line D1 includes the at least one first auxiliary line segment, the second auxiliary line D2 includes the at least one second auxiliary line segment, and the at least one first auxiliary line segment and the at least one second auxiliary line segment are in one-to-one same-layer correspondence. It is taken as an example that the at least one first auxiliary line segment includes the first segment DV1 and the second segment DH1, and that the at least one second auxiliary line segment includes the third segment DV2 and the fourth segment DH2. Reference is further made to FIG. 12. In an embodiment, a first connecting part L1 (e.g., L12) and the first segment DV1 are insulated from each other and disposed in the same layer, and another first connecting part L1 (e.g., L11) and the second segment DH1 are insulated from each other and disposed in the same layer. The first segment DV1 and the third segment DV2 are in a same layer, and the second segment DH1 and the fourth segment DH2 are in a same layer (where the first segment DV1 and the second segment DV2 are not depicted in FIG. 12). In one embodiment the first power voltage line PVEE (for example, located in the M2 metal layer) in the non-display region NA is electrically connected to the cathode layer SE via the first connecting part L11, the first connecting part L11, and the second connecting part L2.

The first connecting part L1 and the first auxiliary line segment being insulated from each other and disposed in the same layer may be implemented as follows. The first connecting part L1 are in one-to-one same-layer correspondence to the first auxiliary line segments in the first auxiliary line, and the first connecting portion L1 and the corresponding first auxiliary line segment are disposed in the same layer and insulated from each other. Since the first auxiliary line segment is configured to transmit signals to the first signal line N1 and the first power voltage line PVEE is overlaid with the cathode layer SE via the first connecting part L1, the first connecting part L1 and the corresponding first auxiliary line segment need to be insulated from each other. In one embodiment, the first auxiliary line D1 includes segments in i layers, which are sequentially arranged in a direction pointing away from the array substrate 10, and there are i corresponding first connecting parts electrically connected in sequence. In one embodiment facilitated that the first power voltage line PVEE is electrically connected to the cathode layer SE sequentially via the i first connecting parts L1 in the non-display region NA and the second connecting part L2.

In FIG. 12, it is taken as an example that each first connecting part L1 and the second connecting part L2 are located in a same groove U1 in the array substrate 10, in order to illustrate how the first power voltage line PVEE is overlaid with the cathode layer SE via the first connecting part L1 and the second connecting part L2. As an alternative, the first connecting part L1 and the second connecting part L2 may be located in different grooves in the array substrate 10, or the first connecting parts L1 may be located in different grooves in the array substrate 10, as long as the first power voltage line PVEE can be overlaid with the cathode layer SE sequentially via the first connecting part(s) L1 and the second connecting part L2 in the non-display region NA.

As discloses above, the second auxiliary line segment(s) are in one-to-one correspondence to the first auxiliary line segment(s), the second auxiliary line segment and the corresponding first auxiliary line segment are disposed in the same layer, and at least a part of the second auxiliary line segment(s) is electrically connected to the cathode layer SE in the display region AA. On such basis, reference is made to FIG. 11. In some embodiments, the second auxiliary line segment (e.g., the third segment DV2) may extend from the display region AA into the non-display region NA, and is electrically connected to the first connecting part L1 which is disposed in the same layer.

Reference is further made to FIG. 3. It is taken as an example that the first auxiliary line segment includes the first segment DV1 and the second segment DH1 in the display region AA, and the second auxiliary line segment includes the third segment DV2 and the fourth segment DH2. Both the first segment DV1 and the third segment DV2 extend along the Y direction, are insulated from each other, and are disposed in the same layer. Both the second segment DH1 and the fourth segment DH2 extend along the Y direction, are insulated from each other, and are disposed in the same layer. Reference is further made to FIG. 12. In the non-display region NA, the first connecting part L12 and the first segment DV1 are disposed in the same layer and insulated from each other, and the first connecting part L11 and the second segment DH1 are disposed in the same layer and insulated from each other. In such case, the third segment DV2 may extend from the display region AA into the non-display region NA along the same layer and be electrically connected to the first connecting part L12. In one embodiment, the fourth segment DH2 may extend from the display region AA into the non-display region NA along the same layer and be electrically connected to the first connecting part L11. In one embodiment, both the third segment DV2 and the fourth segment DH2 may extend from the display region AA into the non-display region NA along the same layers and be electrically connected to the first connecting part L12 and the first connecting part L11, respectively. In FIG. 11, only a case in which the third segment DV2 extends from the display region AA into the non-display region NA is depicted.

Generally, the cathode layer SE may be made of an ITO-Ag-ITO alloy, which has large resistivity and a thin thickness, in order to meet a requirement on light transmittance. The first auxiliary line D1 and the second auxiliary line D2 may be made of a Ti—Al—Ti alloy, which has small resistivity and a large thickness. In one embodiment since the second auxiliary line segment extends from the display region AA into the non-display region NA for connecting to the first connecting part L1 electrically, a cathode potential provided by the first power voltage line PVEE in the non-display region NA can be first transferred onto the second auxiliary line segment via the first connecting part L1, then transferred into the display region AA via the second auxiliary line segment, and then transferred onto the cathode layer SE in the display region AA via the electrical connection between the second auxiliary line segment and the cathode layer SE. The cathode potentials at different light-emitting elements are subject to even smaller variation, the display brightness is more consistent throughout the display pane, and power consumption is reduced. In addition, a width and/or a length of the first power voltage line PVEE in the non-display region NA can be reduced, which facilitates a narrow-frame design.

Figure 13:
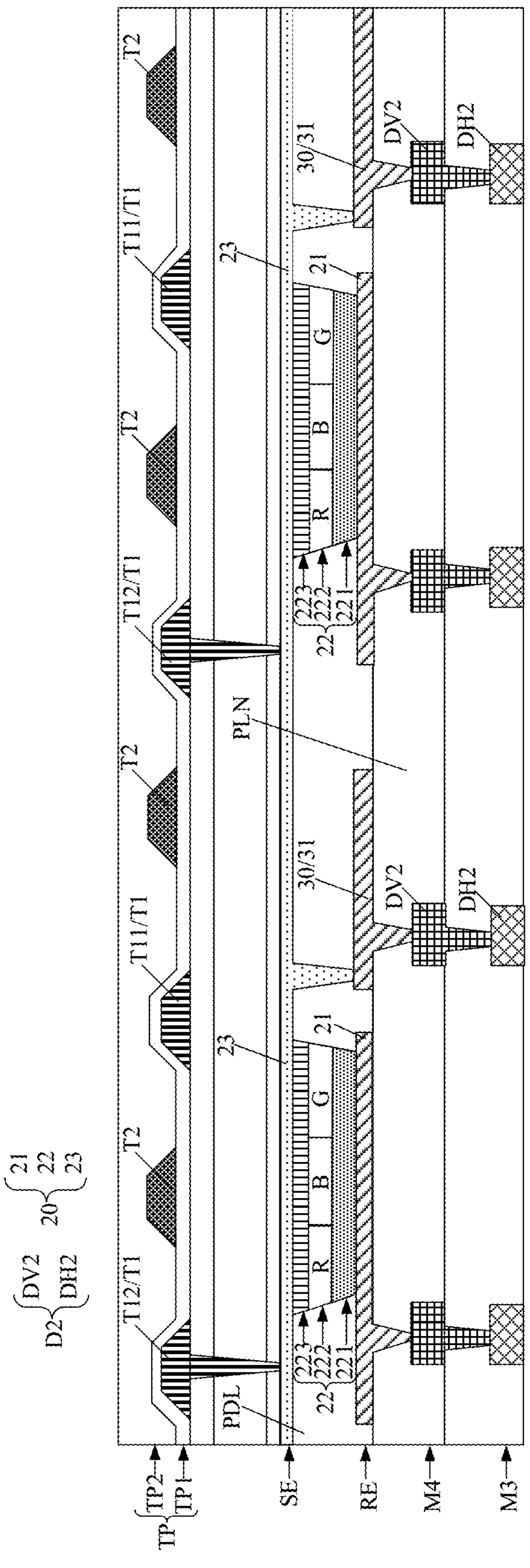
FIG. 13 is a schematic cross-sectional view of a display panel according to another embodiment of the present disclosure.

FIG. 13 shows a schematic cross-sectional view of a display panel according to another embodiment of the present disclosure. As shown in FIG. 13, the display panel further includes a touch layer TP disposed at a side of the cathode layer SE facing away from the array substrate 10. The touch layer TP includes a first touch layer TP1 and a second touch layer TP2, which are arrange in the above-listed sequence along a direction pointing away from the array substrate 10. The first touch layer TP1 includes a first touch line T1, and the second touch layer TP2 includes a second touch line T2. Both the first touch line T1 and the second touch line T2 are located in the display region AA.

The second touch line T2 is configured to transmit touch signals. The first touch line T1 includes a touch connection line T11 and a touch auxiliary line T12. The touch connection line T11 is configured to connect at least a part of the second touch lines T2. The touch connection line T11 and the touch auxiliary line T12 are insulated from each other and are disposed in the same layer. The touch auxiliary line T12 is electrically connected to the cathode layer SE in the display region AA.

In one embodiment the second touch line T2 is configured to transmit touch signals, and the touch connection line T11 in the first touch line T1 is configured to connect at least the part of the second touch lines T2. That is, the touch connection line T11 in the first touch line T1 is overlaid with the second touch line T2.

Similar to the first auxiliary line D1 and the second auxiliary line D2, the first touch line T1 includes the touch auxiliary line T12, which can ensure the uniformity of etching processing and the reflection effect of the display panel. The touch auxiliary line T12 is not overlaid with the second touch line T2 for connection, and the touch auxiliary line T12 and the touch connection line T11 are insulated from each other and disposed in the same layer.

In one embodiment the touch auxiliary line T12 in the first touch line T1 is not overlaid with the second touch line T2 for connection but is electrically connected to the cathode layer SE in the display region AA, which further reduces the resistance of the cathode layer SE. The potential across the cathode is more uniform, uniformity and stability of the cathode potential at different light-emitting elements are improved, and the display brightness is more consistent throughout the display panel.

In one embodiment, similar to the first auxiliary line D1 and the second auxiliary line D2, the first touch line T1 may be made of a Ti—Al—Ti alloy, which has small resistivity and large thickness. In one embodiment the resistance of the cathode layer SE can be reduced when the touch auxiliary line T12 of the first touch line T1 is not overlaid with the second touch line T2 for connection but is electrically connected to the cathode layer SE in the display region AA.

In the foregoing embodiments, the cathode layer SE may cover the entire surface, and the touch auxiliary line T12 in the first touch line T1 may be electrically connected to the cathode layer SE in the non-display region NA. In such case, it is not necessary to damage a packaging layer between the touch layer TP and the light-emitting element 20. In practice, the touch auxiliary line T12 in the first touch line T1 may In one embodiment electrically connected to the cathode layer SE via a through hole in the packaging layer in the display region AA. A specific implementation may depend on an actual situation.

In other embodiments, at least two light-emitting elements 20 have independent cathodes 23.

Figure 14:
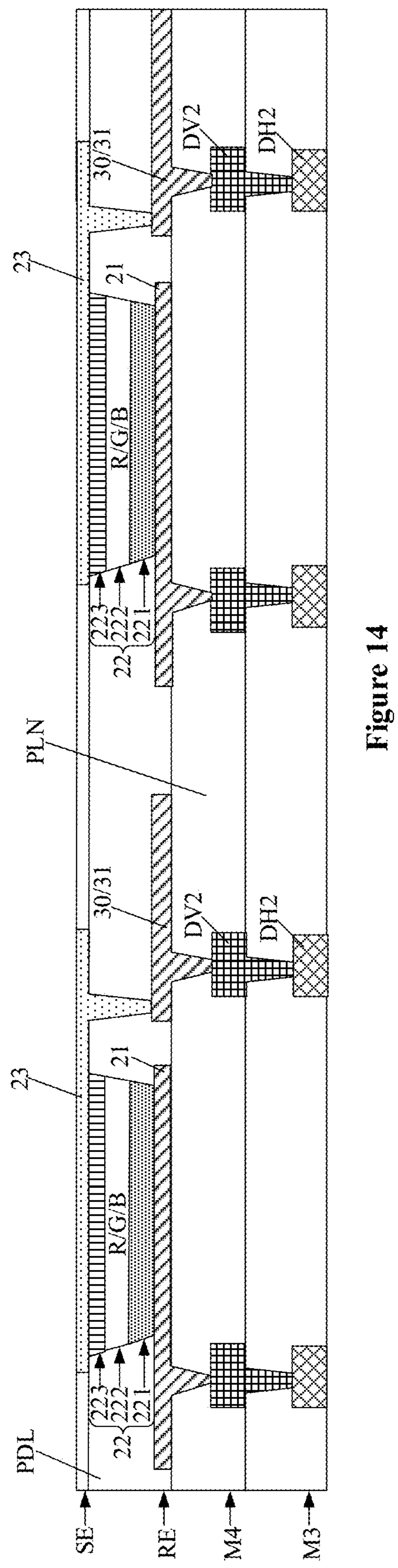
FIG. 14 is a schematic cross-sectional view of a display panel according to another embodiment of the present disclosure.
Figure 15:
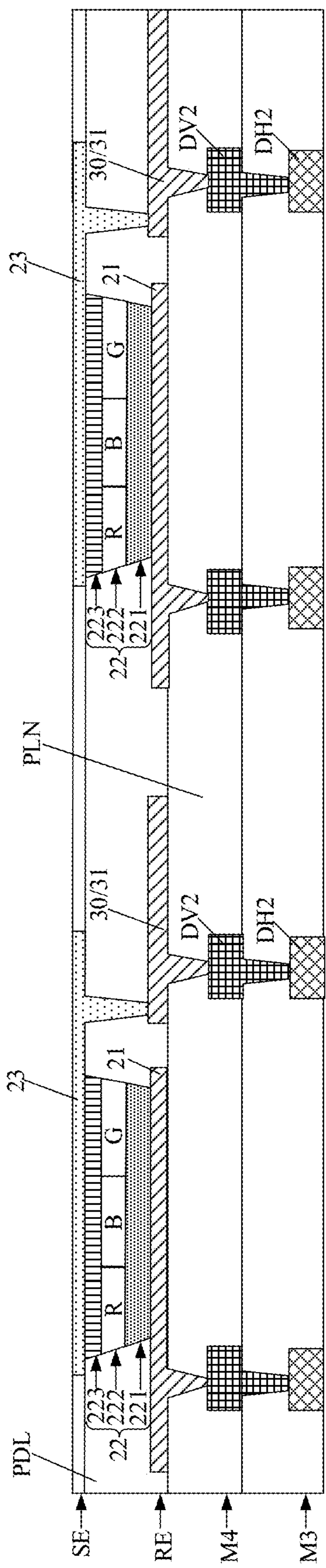
FIG. 15 is a schematic cross-sectional view of a display panel according to another embodiment of the present disclosure.

Reference is made to FIG. 14. At least two light-emitting elements 20 having independent cathodes 23 may be implemented as that each light-emitting element 20 has the independent cathode 23. In one embodiment, the cathodes 23 of a part of the light-emitting elements 20 are connected, and the cathode(s) 23 of another part of light-emitting elements 20 are independent cathodes. Reference is made to FIG. 15. The cathodes 23 of the light-emitting elements 20 in all pixel units px are connected, and the cathodes 23 between different pixel units px are isolated.

As disclosed above, the cathode layer SE may be obtained through evaporation under the CMM when formed by connecting the cathodes 23 of all light-emitting elements 20. When at least two light-emitting elements 20 have independent cathodes 23, the cathode 23 may not be obtained through evaporation under the CMM, but evaporation under a fine metal mask (FMM).

Figure 16:
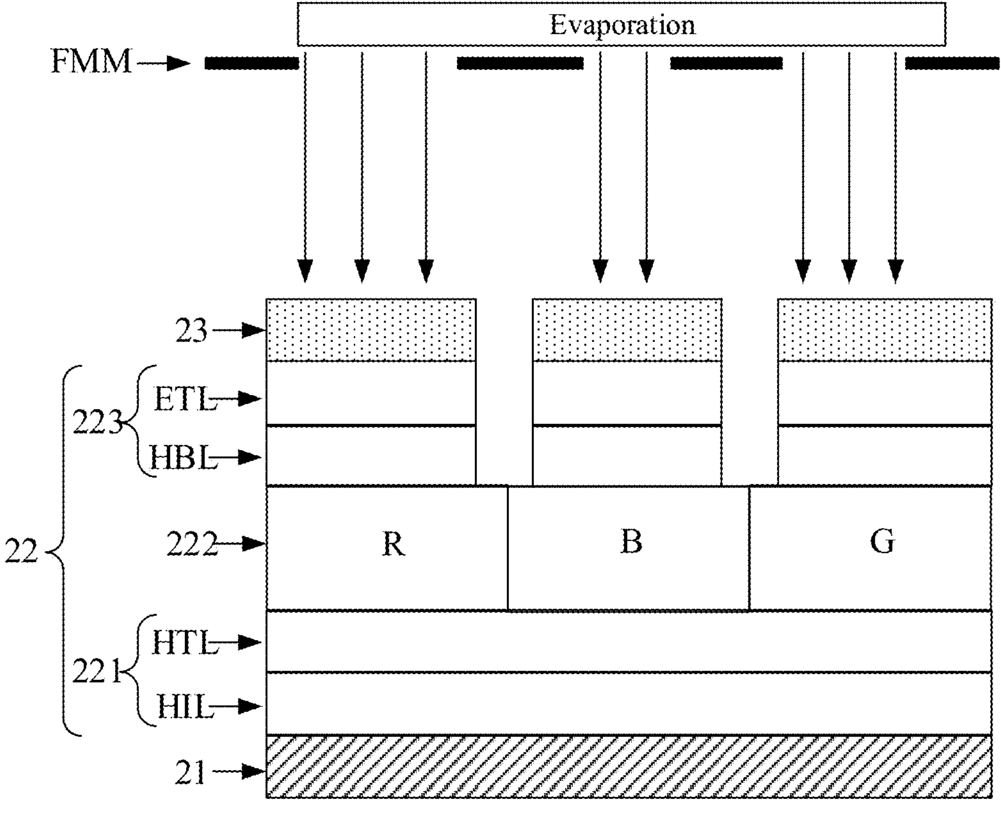
FIG. 16 is a schematic diagram of a process off fabricating a cathode of a light-emitting element in a display panel through an FMM mask according to the embodiment of the present disclosure.
Figure 17:
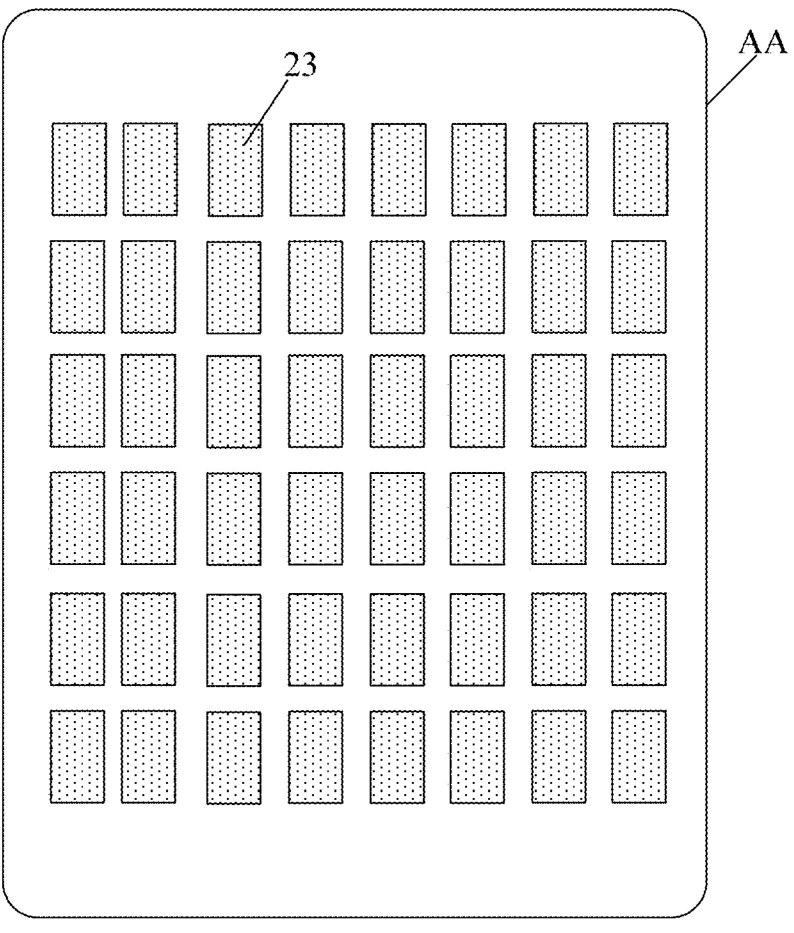
FIG. 17 is a schematic top view of a display panel according to another embodiment of the present disclosure.

FIG. 16 shows a schematic diagram of a process of fabricating the cathode 23 through evaporation under the FMM. FIG. 17 shows a top view of each cathode 23 fabricated through evaporation under the FMM. In comparison with the integral cathode layer SE as shown in FIG. 11, the independent cathodes 23 facilitate reducing the resistance of the cathode 23 of each light-emitting element 20, which improves uniformity and stability of the cathode potential among all light-emitting elements 20. In one embodiment the brightness consistency of the display panel is improved, and power consumption is reduced.

Herein the second auxiliary line segment may be connected in parallel with the cathode 23 in the display region AA regardless the cathodes 23 of the light-emitting elements 20 being independent, partially connected, or integrally connected.

In one embodiment, regardless the cathodes 23 of the light-emitting elements 20 being independent, partially connected, or integrally connected, the first power voltage line PVEE may not be overlaid with the cathode 23 for connection in the non-display region NA. Instead, the first power voltage line PVEE may be overlaid with the first connecting part L1, which is in the same layer as the second auxiliary line segment, in the non-display region NA, and the second auxiliary line segment extending from the display region AA into the non-display region NA is electrically connected to the first connecting part L1 in such layer. In one embodiment the cathode potential provided by the first power voltage line PVEE is transferred, sequentially via the first connecting part L1 and the second auxiliary line segment, to the cathode 23 in the display region AA.

Reference is further made to FIGS. 3 and 11. In an embodiment, the display panel further includes the non-display region NA, which surrounds the display region AA at least partially.

The array substrate 10 further includes the first power voltage line PVEE, which is disposed in the non-display region NA and surrounds the display region AA at least partially.

Figure 18:
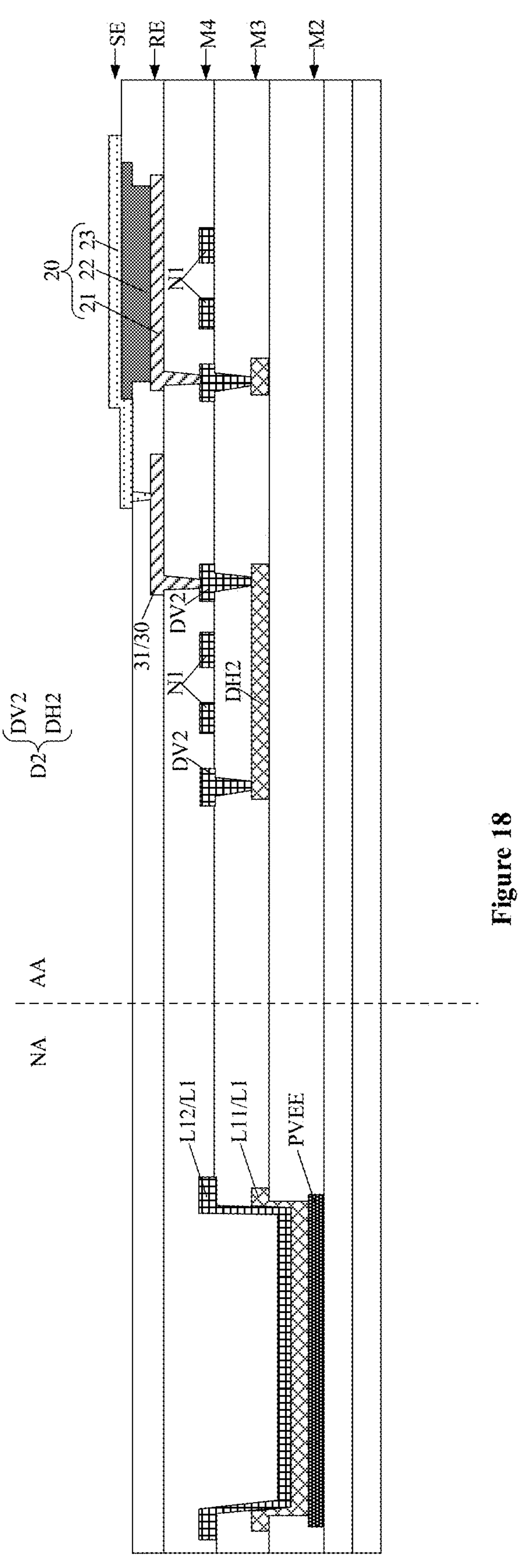
FIG. 18 is a schematic cross-sectional view of a display panel according to another embodiment of the present disclosure.

Reference is made to FIG. 18. In one embodiment, the first power voltage line PVEE may be disposed in the metal layer M2. The display panel further includes the first connecting part L1 and the second connecting part L2, which are disposed in the non-display region NA. The first connecting part L1 and the first auxiliary line segment are insulated from each other and disposed in the same layer.

The first power voltage line PVEE is electrically connected to the first connecting part L1 in the non-display region NA, and the second auxiliary line segment extending from the display region AA into the non-display region NA within the same layer is electrically connected to the first connecting part L1.

As disclosed above, the first connecting part(s) L1 are in one-to-one same-layer correspondence to the first auxiliary line segment(s), and the corresponding ones are insulated from each other. The second auxiliary line segment(s) are also in one-to-one same-layer correspondence to the first auxiliary line segment(s), and the corresponding ones are insulated from each other. Hence, as shown in FIG. 18, the first connecting part L12 and the first segment DV1 are disposed in the same layer and insulated from each other, the first connecting part L12 and the third segment DV2 are disposed in the same layer, the first connecting part L11 and the second segment DH1 are disposed in the same layer and insulated from each other, and the first connecting part L11 and the fourth segment DH2 are disposed in the same layer. Hence, the third segment DV2 may extend from the display region AA into the non-display region NA within the corresponding layer and is electrically connected to the first connecting part L11, and/or the fourth segment DH2 may extend from the display region AA into the non-display region NA within the corresponding layer and is electrically connected to the first connecting part L12. In FIG. 11, only a case in which the third segment DV2 extends from the display region AA into the non-display region NA is depicted.

The first connecting part L1 is located in the non-display region NA, and the first auxiliary line segment and the second auxiliary line segment are both located in the display region AA. In one embodiment the first power voltage line PVEE is connected to the first connecting part L1 in the non-display region NA, and the second auxiliary line segment extends from the display region AA into the non-display region NA for connecting the first connecting part L1. The second auxiliary line segment is further electrically connected to the cathode 23 in the display region AA. Therefore, the cathode potential transmitted by the first power voltage line PVEE is not transferred to the cathode 23 directly in the non-display region NA. Rather, it is first transferred onto the first connecting part L1 in the non-display region NA, then onto the second auxiliary line segment, then from the non-display region NA to the display region AA via the second auxiliary line segment, and eventually to the cathode 23 in the display region AA.

Hence, the cathode potential outputted from the first power voltage line PVEE is mainly transferred to the cathode 23 of each light-emitting element 20 via the first connecting part L1 and the second auxiliary line segment. The first connecting part L1 and the second auxiliary line segment are disposed in the same layer, and both may be made of the Ti—Al—Ti alloy having small resistivity and a large thickness. In one embodiment the cathode potential is transferred to different light-emitting elements in the display region AA with better uniformity and stability, in comparison with conventional technology in which the first power voltage line PVEE transmits the cathode potential directly to the cathode layer SE (generally made of ITO-Ag-ITO alloy which has large resistivity and small thickness) in the non-display region NA and then to the cathode 23 of each light-emitting element 20. Hence, display brightness is more consistent throughout the display panel, and power consumption is reduced. In addition, a width and/or a length of the first power voltage line PVEE in the non-display region NA can be reduced, which facilitates a narrow-frame design.

Figure 19:
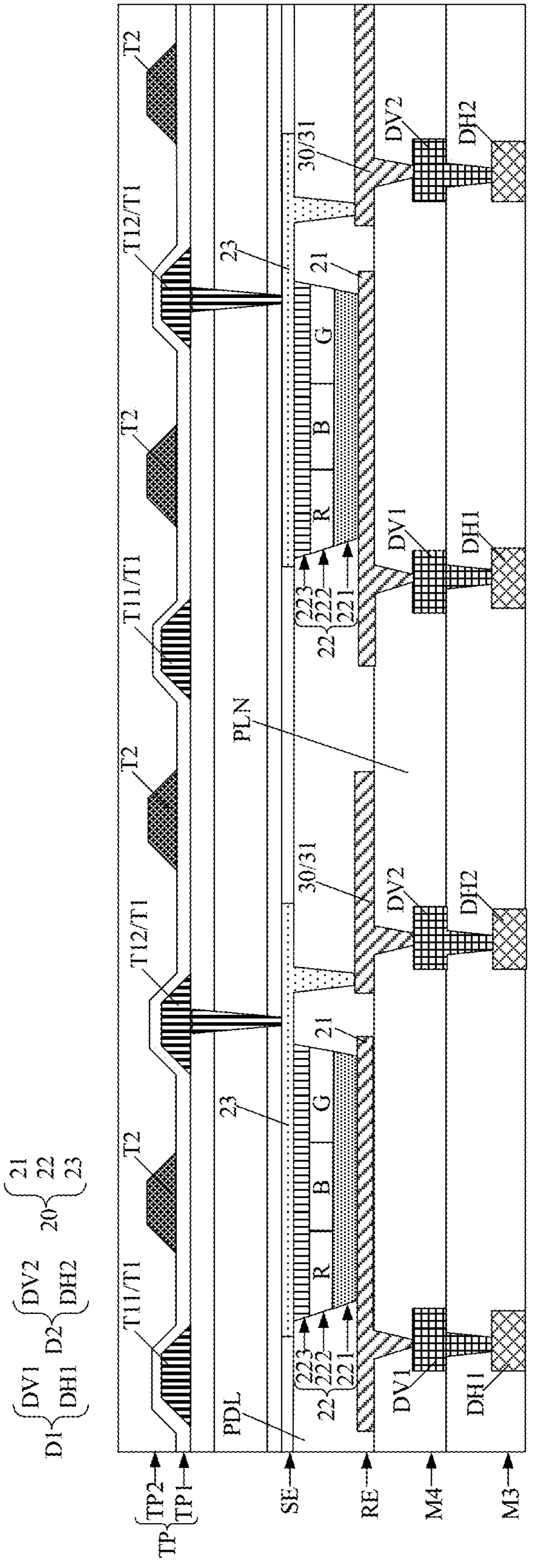
FIG. 19 is a schematic cross-sectional view of a display panel according to another embodiment of the present disclosure.

Reference is made to FIG. 19. In some embodiments, the display panel further includes a touch layer TP disposed at a side of the cathode layer SE facing away from the array substrate 10. The touch layer TP includes a first touch layer TP1 and a second touch layer TP2, which are arrange in the above-listed sequence along a direction pointing away from the array substrate 10. The first touch layer TP1 includes a first touch line T1, and the second touch layer TP2 includes a second touch line T2. Both the first touch line T1 and the second touch line T2 are located in the display region AA.

The second touch line T2 is configured to transmit touch signals. The first touch line T1 includes a touch connection line T11 and a touch auxiliary line T12. The touch connection line T11 is configured to connect at least a part of the second touch lines T2. The touch connection line T11 and the touch auxiliary line T12 are insulated from each other and are disposed in the same layer. The touch auxiliary line T12 is electrically connected to the cathode layer SE in the display region AA.

In one embodiment the second touch line T2 is configured to transmit touch signals, and the touch connection line T11 in the first touch line T1 is configured to connect at least the part of the second touch lines T2. That is, the touch connection line T11 in the first touch line T1 is overlaid with the second touch line T2.

Similar to the first auxiliary line D1 and the second auxiliary line D2, the first touch line T1 includes the touch auxiliary line T12, which can ensure the uniformity of etching processing and the reflection effect of the display panel. The touch auxiliary line T12 is not overlaid with the second touch line T2 for connection, and the touch auxiliary line T12 and the touch connection line T11 are insulated from each other and disposed in the same layer.

In one embodiment the touch auxiliary line T12 in the first touch line T1 is not overlaid with the second touch line T2 for connection but is electrically connected to the cathode layer SE in the display region AA, which further reduces the resistance of the cathode layer SE. The potential across the cathode is more uniform, uniformity and stability of the cathode potential at different light-emitting elements are improved, and the display brightness is more consistent throughout the display panel.

In one embodiment, similar to the first auxiliary line D1 and the second auxiliary line D2, the first touch line T1 may be made of a Ti—Al—Ti alloy, which has small resistivity and large thickness. In one embodiment the resistance of the cathode layer SE can be reduced when the touch auxiliary line T12 of the first touch line T1 is not overlaid with the second touch line T2 for connection but is electrically connected to the cathode layer SE in the display region AA.

In one embodiment, at least two light-emitting elements 20 have independent cathodes 23. In such case, the touch auxiliary line T12 in the first touch line T1 is electrically connected to the cathode 23 via a through hole in a packaging layer, which is disposed between the touch layer TP and the light-emitting element 20, in the display region AA.

In another embodiment, the touch auxiliary line T12 of the first touch line T1, which is not overlaid with the second touch line T2, is electrically connected to the second auxiliary line segment in the display region AA. Since the second auxiliary line segment is connected in parallel with the cathode 23 in the display region AA, the touch auxiliary line T12 of the first touch line T1 may be also connected in parallel with the cathode 23 in the display region AA. The first touch line T1 may be also made of the Ti—Al—Ti alloy, which has small resistivity and a large thickness, to further reduce the resistance of the cathode 23.

In a case that the cathodes 23 of all light-emitting elements 20 are connected to form the cathode layer SE, the cathode layer SE is capable of isolating the touch signal on the second touch line T2 and the signals (e.g., data signals, anode voltage signals, and the like) on each signal line in the array substrate 10, because the cathode potential is fixed. In a case that at least two light-emitting elements 20 have independent cathodes 23, the independent cathodes 23 do not have the above isolating function.

On such basis, in some embodiments, the orthographic projection of the touch auxiliary line T12 on the reference plane overlaps at least partially with the orthographic projection of the second touch line T2 on the reference plane. As disclose above, the touch auxiliary line T12 is electrically connected to the cathode electrode 23 or the second auxiliary line segment in the display region AA, that is, the touch auxiliary line T12 receives the fixed cathode potential. Hence, the orthographic projection of the touch auxiliary line T12 on the reference plane overlapping at least partially with the orthographic projection of the second touch line T2 on the reference plane enables the touch auxiliary line T12 to isolate the touch signal on the second touch line T2 and the signals (e.g., data signal, anode voltage signal, and the like) on each signal line in the array substrate 10. Crosstalk between the touch signal and the signals on each signal line in the array substrate 10 is prevented.

In order to enhance the above isolating function, the orthographic projection of the second touch line T2 on the reference plane may be located within the orthographic projection of the touch auxiliary line T12 on the reference plane.

Reference is further made to FIG. 10. The light-emitting functional layer 22 includes the light-emitting layer(s) 222, which are in one-to-one correspondence to the anodes 21 and to the light-emitting elements 20. That is, each light-emitting layer 222 is independent, and may be fabricated through evaporation under the FMM. In one embodiment, the through hole, which is in the pixel defining layer PDL, connecting the transferring electrode 31 and the cathode 23 is exposed from the light-emitting layer 222. Such exposure prevents the light-emitting layer 222 from extending into the second through hole K2 and being sandwiched between the cathode 23 and the first transferring electrode 31A. That is, additional light emission of light-emitting layer 222 is prevented, and it is prevented that contact resistance between the cathode 23 and the first transferring electrode 31A is increased.

Reference is further made to FIG. 10. The light-emitting functional layer 22 may further include a first conducting layer 221 located between the light-emitting layer 222 and the anode 21, and/or a second conducting layer 223 located between the light-emitting layer 221 and the cathode 23. The first conducting layer 221 and the second conducting layer 223 each may include at least one conducting layer. Reference is further made to FIG. 16. The first conducting layer 221 includes but is not limited to a hole injection layer (HIL) and/or a hole transportation layer (HTL), and the second conducting layer 223 includes but is not limited to a hole blocking layer (HBL) and/or an electron transportation layer (ETL).

Generally, each conducting layer in conventional display panels is a large integral layer, and is fabricated through evaporation under the CMM mask. Reference is further made to FIG. 10. In some embodiments, at least one conducting layer in the light-emitting functional layer 22 is fabricated through evaporation under the FMM, and the second through holes K2 which connects the first transferring electrode 31A and the cathode 23 and which is in the pixel defining layer PDL are exposed. The conducting layer is prevented from extending into the second through hole K2 and being sandwiched between the cathode 23 and the first transferring electrode 31. That is, it is prevented that the contact resistance between the cathode 23 and the first transferring electrode 31 is increased. The conducting layer may be disposed between the light-emitting layer 222 and the anode 21, or between the light-emitting layer 222 and the cathode 23.

In one embodiment, the second through hole K2 connecting the first transferring electrode 31 and the cathode 23 in the pixel defining layer PDL is exposed from the light-emitting layer 222 and each conducting layer in the light-emitting functional layer 22 expose. In one embodiment the light-emitting layer 222 and each conducting layer would not extend into the second through hole K2, and thus would not be sandwiched between the cathode 23 and the first transferring electrode 31. In such case, the cathode 23 can be in direct contact with the first transferring electrode 31 in the second through hole K2, and hence contact resistance between the two is small.

Reference is further made to FIG. 8. In an embodiment, the transferring electrode further includes the second transferring electrode 31B, and the fifth through hole K5 connecting the second transferring electrode 31B and the cathode 23 in the pixel defining layer PDL is exposed from at least one of the light-emitting layer and the multiple conducting layers within the light-emitting functional layer 22. In one embodiment the light-emitting layer and/or the conducting layer would not extend into the fifth through hole K5, and thus would not be sandwiched between the cathode 23 and the second transferring electrode 31B. Contact resistance between the cathode 23 and the second transferring electrode 31B is reduced, and additional light emission is avoided.

A method for manufacturing a display panel is further provided according to an embodiment of the present disclosure. The method includes steps S100 and S200.

Figure 20A:
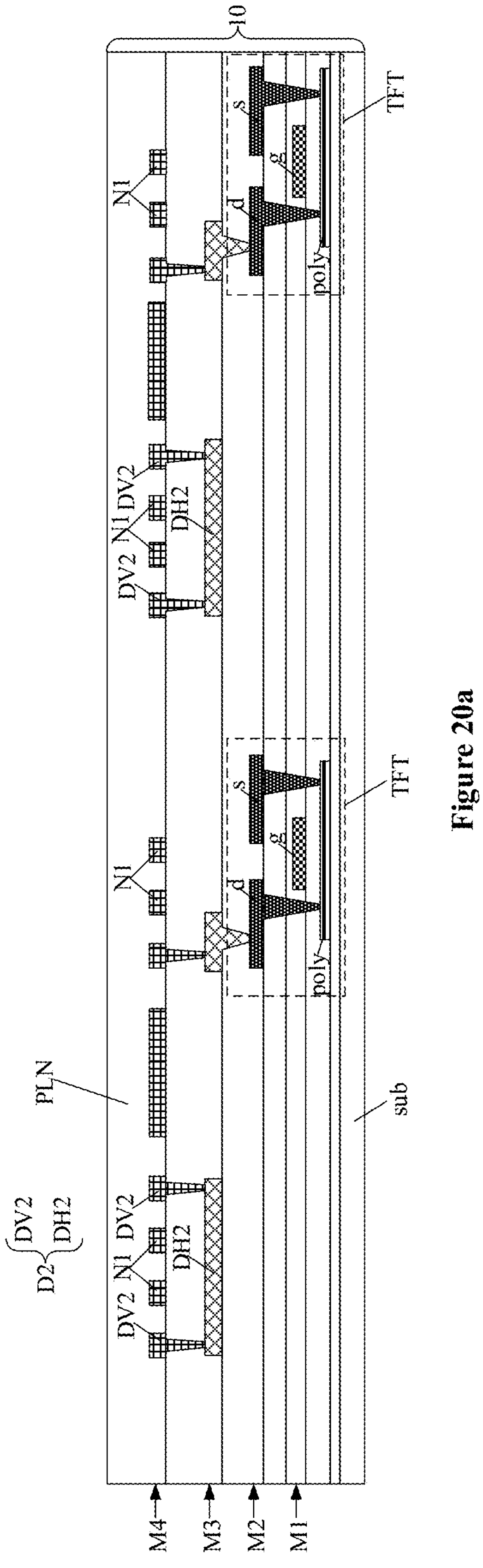
FIGS. 20*a* to 20*c* are schematic diagrams of processes in a method for preparing a display panel according to an embodiment of the present disclosure.

Reference is made to FIG. 20*a*. In step S100, an array substrate 10 is formed. The array substrate includes a first signal line N1, a first auxiliary line D1 (not depicted in FIG. 20), and a second auxiliary line D2.

Reference is made to FIG. 3. The display panel includes a display region AA. The first signal line N1, the first auxiliary line D1 and the second auxiliary line D2 are all disposed in the display region AA. The first auxiliary line D1 is configured to transmit signals to the first signal line N1.

The second auxiliary line D2 is insulated from the first auxiliary line D1. The first auxiliary line D1 includes at least one first auxiliary line segment, and the second auxiliary line D2 includes at least one second auxiliary line segment. The second auxiliary line segment is disposed in the same layer as the first auxiliary line segment.

As shown in FIG. 20*a*, the array substrate 10 further includes a base substrate (sub), an active layer (poly) disposed at a side of the base substrate, and multiple metal layers disposed at a side of the active layer away from the base substrate. The multiple metal layers may include a metal layer M1, a metal layer M2, a metal layer M3, and a metal layer M4, which are arranged in the above listed sequence in a direction pointing away from the base substrate. Different metal layers are separated by insulating layers. In one embodiment multiple pixel circuits (including transistors TFTs, capacitors, and the like) and multiple signal lines are formed in the array substrate 10 to drive the light-emitting elements for light emission.

Reference is made to FIG. 3 in conjunction with FIG. 20*a*. The first signal line N1 extends along the Y direction and is located in the metal layer M4. At least one first auxiliary line segment in the first auxiliary line D1 includes the first segment DV1 and the second segment DH1. The first segment DV1 extends along the Y direction and is located in the metal layer M4. The second segment DH1 extends along the X direction and is located in the metal layer M3. At least one second auxiliary line segment in the second auxiliary line D2 includes a third segment DV2 and a fourth segment DH2, and uniformity of etching processing and the reflection effect of the display panel. The third segment DV2 and the first segment DV1 are disposed in the same layer and extend along the same direction, and the fourth segment DH2 and the second segment DH1 are disposed in the same layer and extend along the same direction.

In one embodiment the first auxiliary line D1 includes the at least one first auxiliary line segment, the second auxiliary line D2 includes the at least one second auxiliary line segment, and the at least one first auxiliary line segment and the at least one second auxiliary line segment are disposed in the same layer(s) based on one-to-one correspondence. Each first auxiliary line segment is insulated from each second auxiliary line segment regardless they are disposed in the same layer or in different layers. Hence, the first auxiliary line D1 and the second auxiliary line D2 are insulated from each other.

Herein the term "same layer" mentioned refers to layer structure(s) formed as follows. Film(s) for a certain pattern are formed through a same filming process, and then patterned under the same mask through a same patterning process. The patterning process may include multiple rounds of exposure, development, or etching, which depends on the pattern. Graphics of the patter in the layer structure(s) may be continuous or discontinuous, and may correspond to different heights or thicknesses. The one-to-one same-layer correspondence between the at least one first auxiliary line segment and the at least one second auxiliary line segment renders etching and reflection of the display panel uniform.

In step S200, multiple light-emitting elements 20 are formed at a side of the array substrate 1. Each light-emitting element includes an anode 21, a light-emitting functional layer 22, and a cathode 23 arranged in the above-list sequence along a direction point away from the array substrate. The cathode 23 is electrically connected to the second auxiliary line segment (e.g., the third segment DV2) in the display region AA.

Figure 20B:
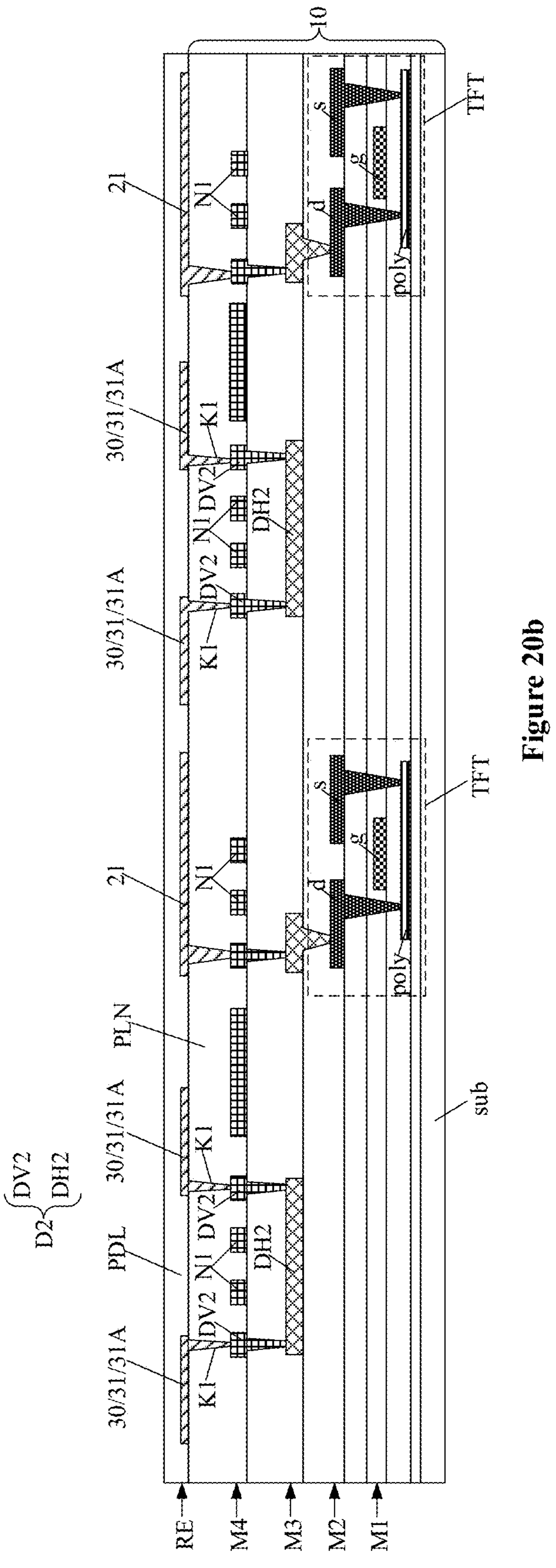

Reference is made to FIG. 20*b*. In an embodiment, the anode(s) 21 are first formed on the side of the array substrate 10, and the anode 21 is electrically connected to a transistor TFT of a pixel circuit in the array substrate 10.

Forming the array substrate 10 further includes following steps.

As shown in FIG. 20*b*, a planarization layer PLN is formed at a side of the second auxiliary line segment (e.g., the third segment DV2) away from the base substrate (that is, at a side facing the light-emitting element 20). A first through hole K1 is formed in the planarization layer PLN.

Forming the anode 21 may further include a following step.

As shown in FIG. 20*b*, a transferring electrode 31 is formed in the display region AA. The transferring electrode 31 and the anode 21 are insulated from each other and are disposed in the same layer. The transferring electrode 31 includes a first transferring electrode 31A. An orthographic projection of the first transferring electrode 31A on a reference plane along which the array substrate extends or which is parallel to the array substrate 10) overlaps at least partially with an orthographic projection of the second auxiliary line segment (e.g., the third segment DV2) on the reference plane. The first transferring electrode 31A is electrically connected to the second auxiliary line segment (e.g., the third segment DV2) via the first through hole K1.

As mentioned above, term "same layer" mentioned refers to layer structure(s) formed through that film(s) for a certain pattern are formed through a same filming process, and then patterned under the same mask through a same patterning process. Herein the anode 21 and the first transferring electrode 31A may be fabricated in the same patterning process while being insulated from each other. In one embodiment manufacturing of the display panel is simplified.

Figure 20C:
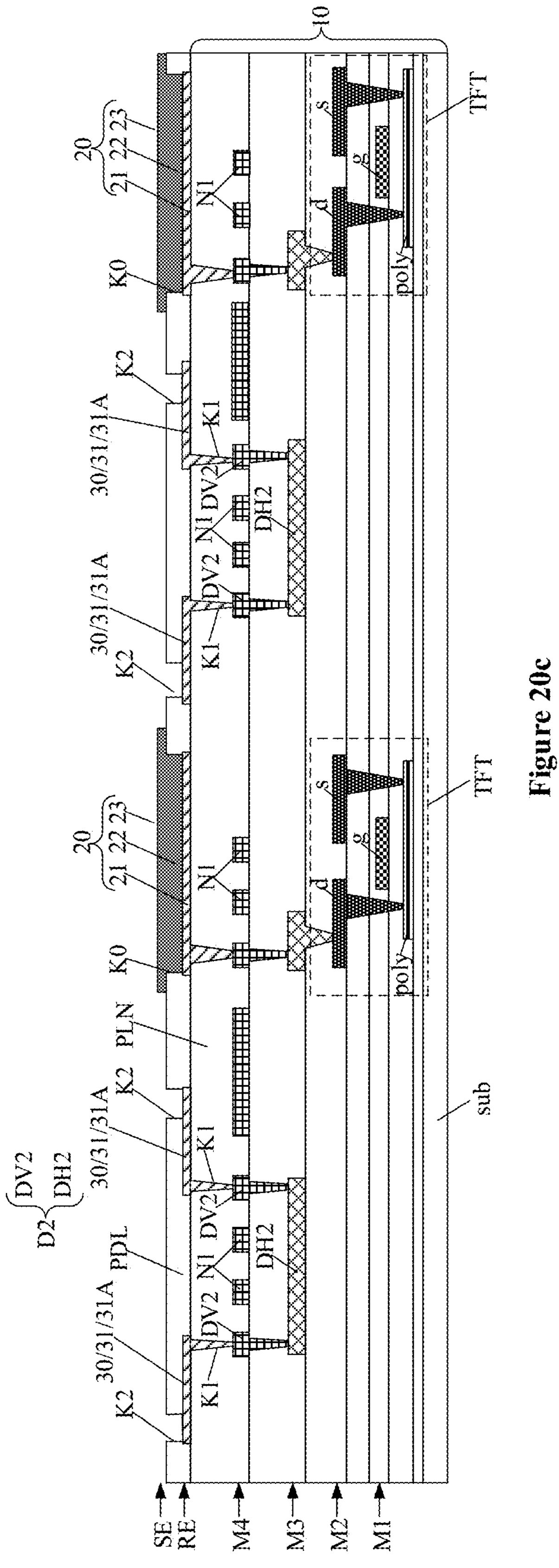

Reference is made to FIG. 20*c*. A pixel defining layer PDL is then formed at a side of the anode 21 away from the array substrate 10. A second through hole K2 is formed in the pixel defining layer PDL. In one embodiment, a pixel opening K0 is formed in a pixel defining layer PDL.

As shown in FIG. 20*c*, a light-emitting functional layer 22 is formed in the pixel opening K0. The light-emitting functional layer 22 is electrically connected to the anode 21 in the pixel opening K0. The light-emitting functional layer 22 may include independent layers or may be an integral layer covering a surface.

Reference is further made to FIG. 4. The cathode 23 is then formed. In one embodiment each light-emitting element 20 includes the anode 21, the light-emitting functional layer 22 and the cathode 23 arranged in the above-listed sequence along the direction pointing away from the array substrate 10. The second auxiliary line segment (e.g., the third segment DV2) is electrically connected to the first transferring electrode 31A via the first through hole K1 in the planarization layer PLN, and thus is electrically connected to the cathode 23 via the second through hole K2 in the pixel defining layer PDL. Hence, that the second auxiliary line segment (e.g., the third segment DV2) is electrically connected to the cathode 23 in the display region AA. In an alternative embodiment, the second auxiliary line segment (e.g., the third segment DV2) may be electrically connected to the cathode 23 directly in the display region AA.

In a case that the cathodes 23 of all light-emitting elements are connected to form a cathode layer SE, the cathode layer SE may be obtained through the CMM evaporation. In a case that the cathodes 23 of at least two light-emitting elements 20 are independent from each other, the cathodes 23 may be obtained through the FMM evaporation.

In one embodiment, a process of fabricating the light-emitting functional layer 22 includes following steps.

A light-emitting layer 222 is formed at a side of the anode 21 away from the array substrate 10. The light-emitting layers 222 are in one-to-one correspondence to the anodes 21. At least one conducting layer is formed between the light-emitting layer 222 and the anode 21, and/or at least one conducting layer is formed between the light-emitting layer 222 and the cathode 23. The conducting layer(s) may be fabricated under the FMM, to expose the second through hole K2. In one embodiment the first transferring electrode 31A can be electrically connected to the cathode 23 via the second through hole K2.

The light-emitting layer 222 has one-to-one correspondence to both the anodes 21 and the light-emitting elements 20. That is, each light-emitting layer 222 may be independently, and may be fabricated through the FMM evaporation. In one embodiment, the second through hole K2 in the pixel defining layer PDL connecting the first transferring electrode 31A and the cathode 23 is exposed from the light-emitting layer 222. Hence, the light-emitting layer 222 would not extend into the second through hole K2, and thus would not be sandwiched between the cathode 23 and the first transferring electrode 31A. Additional light emission is avoided, and contact resistance between the cathode 23 and the first transferring electrode 31A is reduced.

In one embodiment, the at least one conducting layer in the light-emitting functional layer 22 may also be fabricated through evaporation under the FMM, and the second through hole K2 connecting the first transferring electrode 31A and the cathode 23 is exposed the pixel defining layer PDL. In one embodiment the conducting layer would not extend into the second through hole K2 and thus be sandwiched between the cathode 23 and the first transferring electrode 31A. Contact resistance between the cathode 23 and the first transferring electrode 31A is reduced. The conducting layer may be located between the light-emitting layer 222 and the anode 21, or between the light-emitting layer 222 and the cathode 23.

In some embodiments, the manufacturing may further include forming the non-transferring electrode 32 along with forming the anode 21 and the first transferring electrode 31A. That is, the non-transferring electrode 32, the first transferring electrode 31A, and the anode 21 are disposed in the same layer and are insulated from each other. The non-transferring electrode 32 is located in the display region AA. An orthographic projection of the non-transferring electrode 32 on the reference plane overlaps at least partially with an orthographic projection of the first auxiliary line segment (e.g., the first segment DV1) on the reference plane. In one embodiment variation in reflection of external light among different regions of the metal layer RE is reduced, suppressing uneven visibility of the display panel. In one embodiment, the anode 21, the first transferring electrode 31A, and the non-transferring electrode 32 fabricated in one patterning process and insulated from each other can simplify the manufacture of the display panel.

In such case, the fourth through hole K4 connecting the non-transferring electrode 32 and the cathode 23 in the pixel defining layer PDL may also be exposed from at least one of the light-emitting layer and the multiple conducting layers within the light-emitting functional layer 22. In one embodiment the light-emitting layer and/or the conducting layer would not extend into the fourth through hole K4 and thus be sandwiched between the cathode 23 and the non-transferring electrode 32. Contact resistance between the cathode 23 and the non-transferring electrode 32 is reduced, and additional light emission is avoided.

The non-transferring electrode 32 shall not connect the first auxiliary line segment (e.g., the first segment DV1) electrically to the cathode 23. Such restriction has been introduced in detail in the forgoing embodiments and is not repeated herein.

In other embodiments, the manufacturing may further include forming a second transferring electrode 31B along with forming the anode 21 and the first transferring electrode 31A. That is, the first transferring electrode 31A, the second transferring electrode 31B, and the anode 21 are disposed in the same layer and insulated from each other. An orthographic projection of the second transferring electrode 31B on the reference plane overlaps at least partially with the orthographic projection of the first auxiliary line segment (e.g., the first segment DV1) on the reference plane. In one embodiment variation in reflection of external light among different regions of the metal layer RE is reduced, suppressing uneven visibility of the display panel. In addition, the anode 21, the first transferring electrode 31A, and the second transferring electrode 31B are fabricated in one patterning process and insulated from each other can simplify the manufacture of the display panel.

In such case, the sixth through hole K6 connecting the second transferring electrode 31B and the cathode 23 in the pixel defining layer PDL may also be exposed from at least one of the light-emitting layer and the multiple conducting layers within the light-emitting functional layer 22. In one embodiment the light-emitting layer and/or the conducting layer would not extend into the sixth through hole K6 and thus be sandwiched between the cathode 23 and the second transferring electrode 31B. Contact resistance between the cathode 23 and the second transferring electrode 31B is reduced, and additional light emission is avoided.

The second transferring electrode 31B extends within the metal layer RE to implement the electrical connection between the second auxiliary line segment (e.g., the third segment DV2) and the cathode 23. Such extension of the second transferring electrode 31B has been described in detail in the forgoing embodiments and will not be described again.

Figure 21:
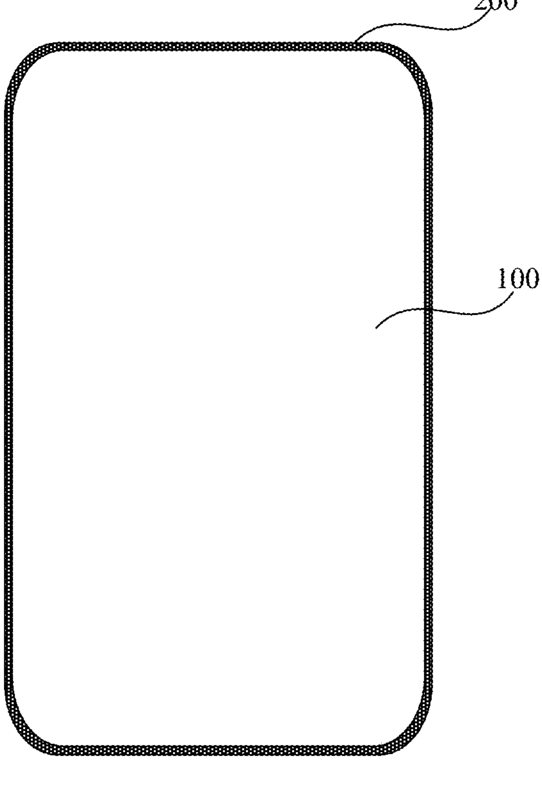
FIG. 21 is a schematic structural diagram of a display device according to an embodiment of the present disclosure.

A display device is further provided according to an embodiment of the present disclosure. Reference is made to FIG. 21. The display device 200 includes the display panel 100 according to any foregoing embodiment. The display panel 100 has been described in detail in the foregoing embodiments, and would not be repeated herein.

The display device 200 may be any electronic device having a display function, for example, may be a touch screen, a mobile phone, a tablet computer, a notebook computer, an electronic paper book, or a television.

The embodiments of the present disclosure are described in a progressive manner in conjunction with a parallel manner, and each embodiment places emphasis on the difference from other embodiments. Therefore, one embodiment can refer to other embodiments for the same or similar parts.

Features in embodiments of the present disclosure may replace each other or combine with each other, and may be implemented or used by the present disclosure according to the description of the disclosed embodiments. Various modifications made to these embodiments may be made, and the general principle defined herein may be implemented in other embodiments without departing from the embodiments of the present disclosure. Therefore, the present disclosure is not limited to the embodiments described herein but conforms to the widest scope in accordance with principles and novel features disclosed in the present disclosure.

The invention claimed is:

1. A display panel, comprising:

an array substrate, wherein:

the array substrate comprises a first signal line, a first auxiliary line, and a second auxiliary line, which are disposed in a display region of the display panel;

the first auxiliary line is configured to transmit signals to the first signal line, and comprises at least one first auxiliary line segment;

the second auxiliary line is insulated from the first auxiliary line, and comprises at least one second auxiliary line segment; and each of the at least one second auxiliary line segment is disposed in a same layer as a corresponding one of the at least one first auxiliary line segment;

a plurality of light-emitting elements disposed at a side of the array substrate, wherein:

each light-emitting element of the plurality of light-emitting elements comprises an anode, a light-emitting functional layer, and a cathode, which are arranged in the above-listed sequence along a direction pointing away from the array substrate; and the cathode is electrically connected to the at least one second auxiliary line segment in the display region.

2. The display panel according to claim 1, further comprising at least one auxiliary electrode, wherein:

the at least one auxiliary electrode comprises at least one transferring electrode;

the at least one transferring electrode is disposed in the display region, and is disposed between the at least one second auxiliary line segment and the cathode of each light-emitting element along a direction perpendicular to the array substrate; and the at least one second auxiliary line segment is electrically connected to the cathode of a light-emitting element of the plurality of light emitting elements via a corresponding one of the at least one transferring electrode in the display region.

3. The display panel according to claim 2, wherein the anode is insulated from the at least one transferring electrode, and is disposed in a same layer as the at least one transferring electrode.

4. The display panel according to claim 3, wherein:

the transferring electrode comprises a first transferring electrode;

an orthographic projection of the first transferring electrode on a reference plane, along which the array extends, at least partially with an orthographic projection of the at least one second auxiliary line segment on the reference plane;

the array substrate further comprises a planarization layer disposed at a side of the at least one second auxiliary line segment facing the light-emitting element, at least one first through hole is provided in the planarization layer, and the at least one second auxiliary line segment is electrically connected to the first transferring electrode via a corresponding one of the at least one first through hole; and the display panel further comprises a pixel defining layer disposed between the anode and the light-emitting functional layer, at least one second through hole is provided in the pixel defining layer, and the first transferring electrode is electrically connected to the cathode of a light-emitting element of the plurality of light-emitting elements via a corresponding one of the at least one second through hole.

5. The display panel according to claim 4, wherein:

the at least one auxiliary electrode further comprises a non-transferring electrode;

the non-transferring electrode is disposed in a same layer as the first transferring electrode and the anode of each light-emitting element, and are insulated from the first transferring electrode and the anode of each light-emitting element;

the non-transferring electrode is located in the display region, and an orthographic projection of the non-transferring electrode on the reference plane overlaps at least partially with an orthographic projection of the at least one first auxiliary line segment on the reference plane.

6. The display panel according to claim 5, wherein:

at least one third through hole is provided in the planarization layer, and the at least one first auxiliary line segment is electrically connected to the non-transferring electrode via a corresponding one of the at least one third through hole;

the non-transferring electrode and the cathode of each light-emitting element are isolated by the pixel defining layer.

7. The display panel according to claim 5, wherein:

at least one fourth hole is provide in the pixel defining layer, and the non-transferring electrode is electrically connected to the cathode of the light-emitting element or another light-emitting element of the plurality of light-emitting elements via a corresponding one of the at least one fourth through hole; and the non-transferring electrode and the at least one first auxiliary line segment are isolated by the planarization layer.

8. The display panel according to claim 4, wherein:

the at least one transferring electrode further comprises a second transferring electrode;

the second transferring electrode is disposed in a same layer as the first transferring electrode and the anode of each light-emitting element, and are insulated from the first transferring electrode and the anode of each light-emitting element;

an orthographic projection of the second transferring electrode on the reference plane overlaps at least partially with an orthographic projection of the at least one first auxiliary line segment on the reference plane;

at least one fifth through hole is provided in the planarization layer, and the second transferring electrode is electrically connected to the at least one second auxiliary line segment via a corresponding one of the at least one fifth through hole;

at least one sixth through hole is provided in the pixel defining layer, and the second transferring electrode is electrically connected to the cathode of the cathode of the light-emitting element or another light-emitting element of the plurality of light-emitting elements via a corresponding one of the at least one sixth through hole; and the orthographic projection area of the second transferring electrode on the reference plane is greater than the orthographic projection area of the first transferring electrode on the reference plane.

9. The display panel according to claim 4, wherein:

the at least one first auxiliary line segment extends along a first direction and is arranged sequentially along a second direction, and the first direction and the second direction are parallel with the reference plane and are not parallel with each other;

the at least one second auxiliary line segment extends along the first direction and is sequentially arranged along the second direction;

the orthographic projection of the second auxiliary line segment on the reference plane overlaps at least partially with an orthographic projection of the corresponding one of at least one fifth through hole on the reference plane; and the at least one first auxiliary line segment and the at least one second auxiliary line segment are alternately arranged along the second direction.

10. The display panel according to claim 1, wherein:

the at least one first auxiliary line segment comprises a first segment and a second segment, the first segment and the second segment are disposed in different layers, and an extending direction of the first segment is not parallel with an extending direction of the second segment; and the first segment and the second segment overlap in a first region when viewed along a direction perpendicular to a reference plane along which the array extends, and are electrically connected in the first region.

11. The display panel according to claim 10, wherein:

the at least one second auxiliary line segment comprises a third segment and a fourth segment, the third segment is disposed in a same layer as the first segment, an extending direction of the third segment is identical to the extending direction of the first segment, the fourth segment is disposed in a same layer as the second segment, and an extending direction of the fourth segment is identical to the extending direction of the second segment;

a projection of the third segment on the reference plane and a projection of the fourth segment on the reference plane are arranged to form a grid; and the third segment and the fourth segment are electrically connected in a region, and the third segment overlaps with the fourth segment in the direction perpendicular to the reference plane.

12. The display panel according to claim 1, wherein the cathode of each light-emitting element belong to a same cathode layer, and an orthographic projection of the display region on the reference plane is located within an orthographic projection of the cathode layer on the reference plane.

13. The display panel according to claim 1, further comprising:

a non-display region surrounding the display region at least partially, wherein:

the array substrate further comprises a first power voltage line disposed in the non-display region, and the first power voltage line is electrically connected to a cathode layer in the non-display region.

14. The display panel according to claim 13, further comprising:

a first connecting part and a second connecting part, which are disposed in the non-display region, wherein:

the first connecting part is disposed in a same layer as the at least one first auxiliary line segment and is insulated from the at least one first auxiliary line segment, and the second connecting part is disposed in a same layer as the anode of each light-emitting element and is insulated from the anode of each light-emitting element; and the first power voltage line is electrically connected to the cathode layer via the first connecting part and the second connecting part sequentially.

15. The display panel according to claim 14, wherein the at least one second auxiliary line segment extends within a layer from the display region into the non-display region, and is electrically connected to the first connecting part in the layer.

16. The display panel according to claim 12, further comprising:

a touch layer located at a side of the cathode layer away from the array substrate, wherein:

the touch layer comprises a first touch layer and a second touch layer, and the second touch layer is disposed at a side of the first touch layer away from the array substrate;

the first touch layer comprises a first touch line, the second touch layer comprises a second touch line, and both the first touch line and the second touch line are disposed in the display region;

the second touch line is configured to transmit touch signals; and the first touch line comprises a touch connection section and a touch auxiliary section, the touch connection section is configured to connect at least a part of the second touch line, the touch auxiliary section is disposed in a same layer as the touch connection section and is insulated from the touch connection section, and the touch auxiliary section is electrically connected to the cathode layer in the display region.

17. The display panel according to claim 1, wherein the cathodes of at least two light-emitting elements of the plurality of light-emitting elements are independent from each other.

18. The display panel according to claim 17, further comprising:

a non-display region at least partially surrounding the display region, wherein:

the array substrate further comprises a first power voltage line disposed in the non-display region;

the display panel further comprises a first connecting part disposed in the non-display region, and the first connecting part is disposed in a same layer as the at least one first auxiliary line segment and is insulated from the at least one first auxiliary line segment;

the first power voltage line is electrically connected to the first connecting part in the non-display region; and the at least one second auxiliary line segment extends within a layer from the display region into the non-display region, and is electrically connected to the first connecting part in the layer.

19. The display panel according to claim 17, further comprising:

a touch layer located at a side of the cathode of each light-emitting elements away from the array substrate, wherein:

the touch layer comprises a first touch layer and a second touch layer, and the second touch layer is disposed at a side of the first touch layer away from the array substrate;

the first touch layer comprises a first touch line, the second touch layer comprises a second touch line, and both the first touch line and the second touch line are disposed in the display region;

the second touch line is configured to transmit touch signals; and the first touch line comprises a touch connection section and a touch auxiliary section, the touch connection section is configured to connect at least a part of the second touch line, the touch auxiliary section is disposed in a same layer as the touch connection section and is insulated from the touch connection section, and the touch auxiliary section is electrically connected to the cathode layer in the display region.

20. The display panel according to claim 19, wherein an orthographic projection of the touch auxiliary section on a reference plane overlaps at least partially with an orthographic projection of the second touch line on the reference plane.

21. The display panel according to claim 4, wherein:

the light-emitting functional layer comprises a light-emitting layer;

the light-emitting functional layer further comprises one or both of: at least one first conducting layer disposed between the light-emitting layer and the anode, and at least one second conducting layer disposed between the light-emitting layer and the cathode; and the at least one first conducting layer exposes the at least one second hole, and the at least one second conducting layer exposes the at least one second hole.

22. A method for preparing a display panel, comprising:

forming an array substrate, wherein:

the array substrate comprises a first signal line, a first auxiliary line, and a second auxiliary line, which are disposed in a display region of the display panel;

the first auxiliary line is configured to transmit signals to the first signal line, and comprises at least one first auxiliary line segment;

the second auxiliary line is insulated from the first auxiliary line, and comprises at least one second auxiliary line segment; and forming a plurality of light-emitting elements at a side of the array substrate, wherein:

each light-emitting element of the plurality of light-emitting elements comprises an anode, a light-emitting functional layer, and a cathode, which are arranged in the above-listed sequence along a direction pointing away from the array substrate; and the cathode is electrically connected to the at least one second auxiliary line segment in the display region.

23. The method according to claim 22, wherein the forming the array substrate further comprises:

forming a planarization layer at a side of the at least one second auxiliary line segment facing the plurality of light-emitting elements; and forming at least one first through hole in the planarization layer;

wherein forming the plurality of light-emitting elements at the side of the array substrate comprises forming the anode of each light-emitting element and forming the light-emitting functional layer of each light-emitting element;

wherein forming the anode of each light-emitting element comprises forming a transferring electrode in the display region, wherein:

the transferring electrode is disposed in a same layer the anode of each light-emitting element and is insulated from the anode of each light-emitting element;

the transferring electrode comprises a first transferring electrode;

an orthographic projection of the first transferring electrode on a reference plane, along which the array substrate extends, overlaps at least partially with an orthographic projection of the at least one second auxiliary line segment on the reference plane; and the first transferring electrode is electrically connected to the at least one second auxiliary line segment via a corresponding one of the at least one first through hole;

wherein before forming the light-emitting functional layer of each light-emitting element, the method further comprises:

forming a pixel defining layer at a side of the anode of each light-emitting element facing away from the array substrate, and forming at least one second through hole in the pixel defining layer;

wherein forming the light-emitting functional layer of each light-emitting element comprises:

forming a light-emitting layer at the side of the anode of said light-emitting element facing away from the array substrate, and forming at least one of: at least one first conducting layer between the light-emitting layer and the anode of said light-emitting element, and at least one conducting layer between the light-emitting layer and the cathode of said light-emitting element; and wherein the at least one first conducting layer exposes the at least one second hole, the at least one second conducting layer exposes the at least one second hole, and the first transferring electrode is electrically connected to the cathode of a light-emitting element of the plurality of light-emitting elements via a corresponding one of the at least one second through hole.

24. A display device, comprising a display panel, comprising:

an array substrate, wherein:

the array substrate comprises a first signal line, a first auxiliary line, and a second auxiliary line, which are disposed in a display region of the display panel;

the first auxiliary line is configured to transmit signals to the first signal line, and comprises at least one first auxiliary line segment;

the second auxiliary line is insulated from the first auxiliary line, and comprises at least one first auxiliary line segment; and each of the at least one second auxiliary line segment is disposed in a same layer as a corresponding one of the at least one first auxiliary line segment;

a plurality of light-emitting elements disposed at a side of the array substrate, wherein:

each light-emitting element of the plurality of light-emitting elements comprises an anode, a light-emitting functional layer, and a cathode, which are arranged in the above-listed sequence along a direction pointing away from the array substrate; and the cathode is electrically connected to the at least one second auxiliary line segment in the display region.

* * * * *